(12) United States Patent
Darmawikarta et al.

(10) Patent No.: US 11,309,192 B2
(45) Date of Patent: Apr. 19, 2022

(54) INTEGRATED CIRCUIT PACKAGE SUPPORTS

(71) Applicant: Intel Corporation, Santa Clara, CA (US)

(72) Inventors: Kristof Kuwawi Darmawikarta, Chandler, AZ (US); Robert May, Chandler, AZ (US); Sri Ranga Sai Boyapati, Chandler, AZ (US); Srinivas V. Pietambaram, Gilbert, AZ (US); Chung Kwang Christopher Tan, Portland, OR (US); Aleksandar Aleksov, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 783 days.

(21) Appl. No.: 16/000,205

(22) Filed: Jun. 5, 2018

(65) Prior Publication Data

US 2019/0371621 A1 Dec. 5, 2019

(51) Int. Cl.
*H01L 21/48* (2006.01)
*H01L 23/498* (2006.01)

(52) U.S. Cl.
CPC ........ *H01L 21/4857* (2013.01); *H01L 21/481* (2013.01); *H01L 21/486* (2013.01); *H01L 23/49822* (2013.01); *H01L 23/49838* (2013.01)

(58) Field of Classification Search
CPC .............. H01L 2224/19; H01L 23/481; H01L 23/5226; H01L 2224/16225; H01L 23/49827; H05K 1/115; H05K 2201/10378
See application file for complete search history.

(56) References Cited

U.S. PATENT DOCUMENTS

| | | | |
|---|---|---|---|
| 2004/0178484 A1* | 9/2004 | Burdick, Jr. | H01L 23/49827 257/678 |
| 2004/0266179 A1 | 12/2004 | Sharma | |
| 2008/0054313 A1 | 3/2008 | Dyer et al. | |
| 2008/0150127 A1* | 6/2008 | Raravikar | H01L 23/373 257/712 |
| 2009/0075465 A1 | 3/2009 | Fan | |
| 2012/0048604 A1* | 3/2012 | Cornejo | C03C 21/002 174/258 |
| 2013/0267092 A1 | 10/2013 | Shin et al. | |
| 2013/0334682 A1* | 12/2013 | Kim | H01L 23/3128 257/737 |
| 2015/0206836 A1 | 7/2015 | Bian | |
| 2016/0365271 A1* | 12/2016 | Chang | H01L 21/76811 |

(Continued)

OTHER PUBLICATIONS

International Preliminary Search Report Opinion for International Patent Application No. PCT/US2015/052460 dated Mar. 27, 2018, 8 pages.

(Continued)

*Primary Examiner* — John A Bodnar
(74) *Attorney, Agent, or Firm* — Patent Capital Group

(57) ABSTRACT

Disclosed herein are integrated circuit (IC) package supports and related apparatuses and methods. For example, in some embodiments, an IC package support may include a non-photoimageable dielectric, and a conductive via through the non-photoimageable dielectric, wherein the conductive via has a diameter that is less than 20 microns. Other embodiments are also disclosed.

25 Claims, 11 Drawing Sheets

(56) References Cited

U.S. PATENT DOCUMENTS

2018/0102469 A1\* 4/2018 Das .................... H01L 39/2493

OTHER PUBLICATIONS

International Search Report and Written Opinion for International Patent Application No. PCT/US2015/052460 dated May 30, 2016, 12 pages.
United States Patent Application filed Jan. 19, 2018, U.S. Appl. No. 15/745,701, 34 pages.

\* cited by examiner

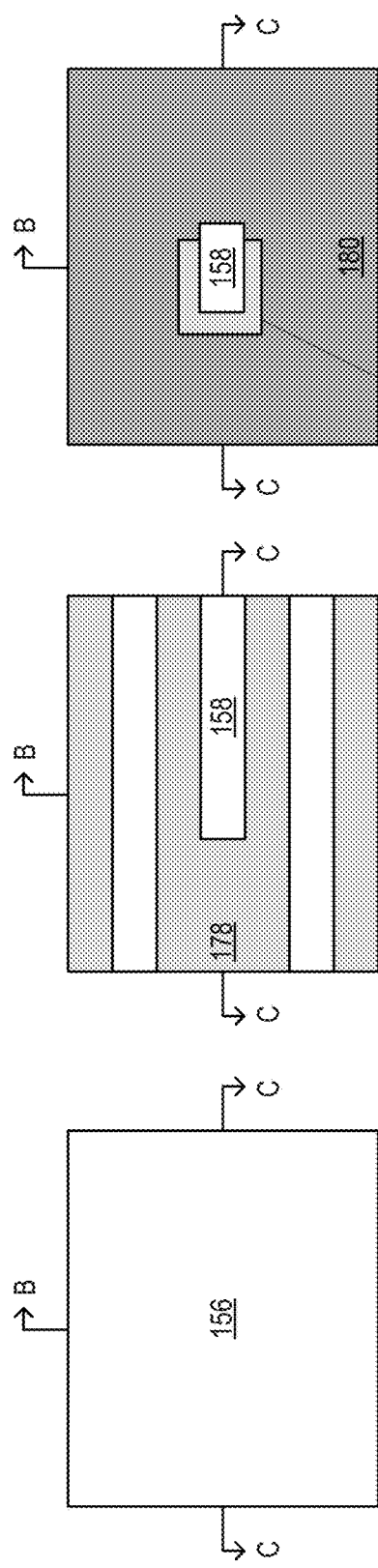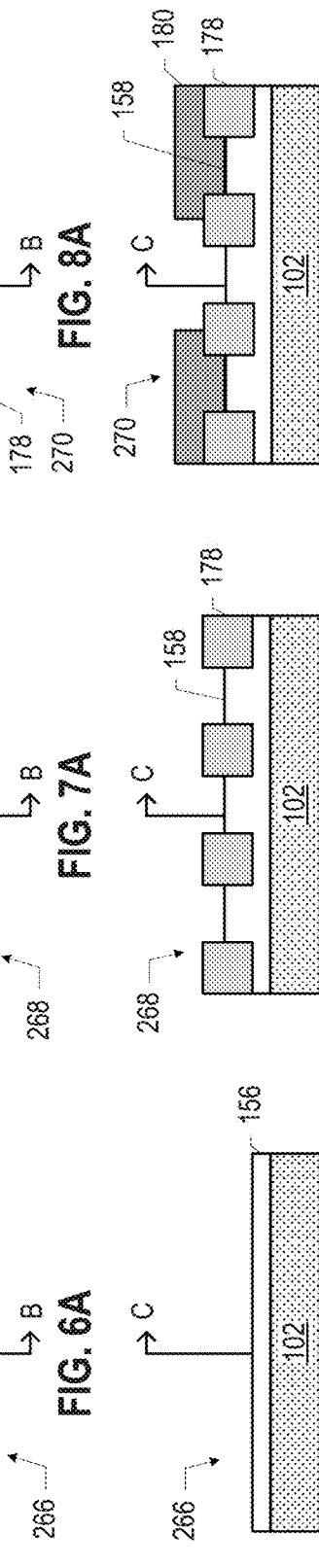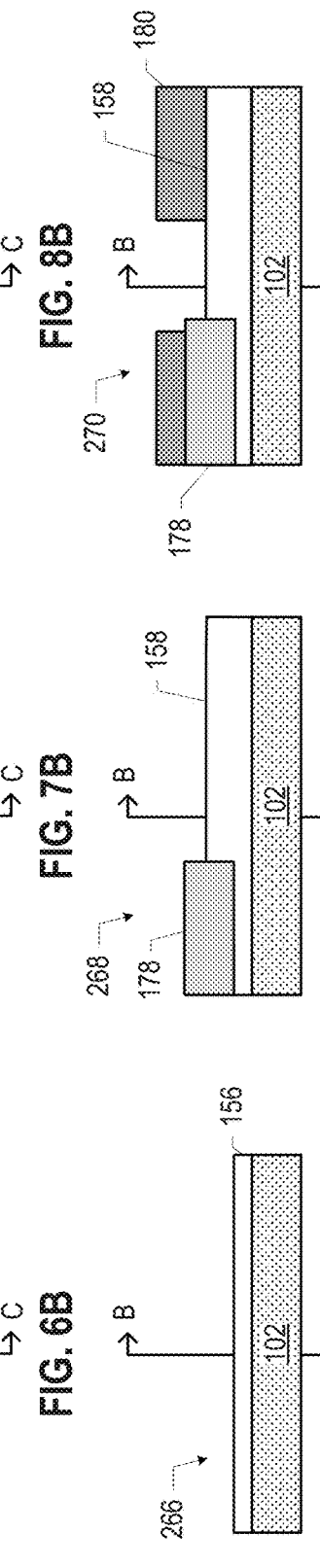

INTEGRATED CIRCUIT PACKAGE SUPPORTS

BACKGROUND

Conventional integrated circuit (IC) package substrates and interposers may be used to spread electrical pathways from a narrower pitch to a wider pitch, among other purposes. Such electrical pathways typically include a conductive material insulated from other electrical pathways by one or more dielectric materials.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 6A-6C, 7A-7C, and 8A-8C illustrate stages in an example process of manufacturing an IC package support, in accordance with various embodiments.

DETAILED DESCRIPTION

Figure 1:
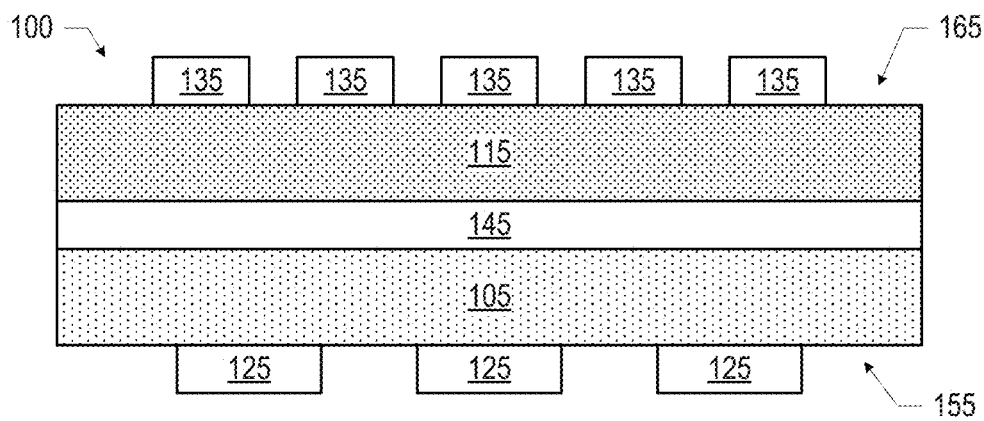
FIG. 1 is a cross-sectional side view of an integrated circuit (IC) package support, in accordance with various embodiments.

Disclosed herein are integrated circuit (IC) package supports and related apparatuses and methods. For example, in some embodiments, an IC package support may include a non-photoimageable dielectric, and a conductive via through the non-photoimageable dielectric, wherein the conductive via has a diameter that is less than 20 microns. Other embodiments are also disclosed.

Conventional packaging techniques are limited in their capabilities and performance, and thus may not be suitable for high bandwidth, small form factor applications. For example, some conventional photoimageable dielectrics (PIDs) may allow for small via features to achieve a high interconnect density, but these materials may have undesirable mechanical and electrical properties (e.g., high loss tangents that reduce efficiency and the achievable communication bandwidth and/or high coefficients of thermal expansion that may lead to cracking or warpage during use). Adjusting the properties of such PIDs (e.g., by increasing the filler particle loading) may improve mechanical stability at the expense of interconnect density (e.g., due to increased scattering caused by the filler particles).

Various ones of the embodiments disclosed herein may achieve a high interconnect density without the mechanical or electrical drawbacks of existing technologies, and may do so at a reduced cost with higher reliability. For example, some of the embodiments disclosed herein include a dielectric planarization operation instead of a metal planarization operation, as required by some conventional techniques; dielectric planarization may be simpler and may be performed at lower cost than metal planarization. Some embodiments disclosed herein may include lithographically defined vias that are electroplated (e.g., with copper) to form the "vertical" interconnects in a high-density portion of an IC package support. Some embodiments disclosed herein may include self-aligned features (e.g., vias and lines) that may allow the volume of metal (e.g., copper) in a package substrate or interposer to be increased (e.g., by more than an order of magnitude) to improve reliability. Some embodiments disclosed herein may combine via reveal operations with planarization in a laserless process than may involve fewer steps than conventional fabrication techniques while still supporting the "flatness" requirements for reliability in high-density applications. Laserless processes may also reduce misalignment, and thus increase the achievable interconnect density.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. For convenience, the phrase "FIG. 2" may be used to refer to the collection of drawings of FIGS. 2A-2V, the phrase "FIG. 3" may be used to refer to the collection of drawings of FIGS. 3A-3C, etc.

FIG. 1 is a cross-sectional side view of an IC package support 100, in accordance with various embodiments. The IC package support 100 may be included in an IC package in any of a number of ways; for example, the IC package support 100 may be a package substrate or an interposer (e.g., as discussed below with reference to FIG. 11.

The IC package support 100 may include conductive pathways between a first face 155 and a second face 165, conductive pathways between different locations on the first face 155, and/or conductive pathways between different locations on the second face 165. The IC package support 100 may include a coarse line space portion 105, a fine line space portion 115, and a transition portion 145 between the coarse line space portion 105 and the fine line space portion 115. As used herein, "coarse" and "fine" are relative terms, denoting that the minimum spacing between features (e.g., conductive lines, referred to herein as "lines") in the coarse line space portion 105 is greater than the minimum spacing between features in the fine line space portion 115. In some embodiments, the minimum size of features in the coarse line space portion 105 may be greater than the minimum size of features the fine line space portion 115. For example, the minimum width of a line and/or the minimum diameter of a conductive via (referred to herein as a "via") in the coarse line space portion 105 may be greater than the minimum width of a line and/or the minimum diameter of a via, respectively, in the fine line space portion 115. In some embodiments, the minimum spacing between adjacent lines in the coarse line space portion 105 may be greater than 5 microns (e.g., 10 microns), while the minimum spacing between adjacent lines in the fine line space portion 115 may be less than 5 microns (e.g., 2 microns). In some embodiments, the minimum width of a line in the coarse line space portion 105 may be greater than 5 microns (e.g., 10 microns), while the minimum width of a line in the fine line space portion 115 may be less than 5 microns (e.g., 2 microns). In some embodiments, the minimum diameter of the via in the coarse line space portion 105 may be greater than 20 microns (e.g., greater than 25 microns, or greater than 40 microns), while the minimum diameter of a via in the fine line space portion 115 may be less than 20 microns (e.g., less than 10 microns, or between 2 microns and 15 microns). In the transition portion 145, conductive features (such as lines and vias) may have dimensions suitable to electrically interconnect conductive features in the coarse line space portion 105 with conductive features and the fine line space portion 115.

The IC package support 100 may include conductive contacts 125 at the first face 155 (proximate to the coarse line space portion 105), and conductive contacts 135 at the second face 165 (proximate to the fine line space portion 115). As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket). In some embodiments, the width of the conductive contacts 125 may be greater than the width of the conductive contacts 135; in some embodiments, the minimum spacing between adjacent conductive contacts 125 may be greater than the minimum spacing between adjacent ones of the conductive contacts 135. In some embodiments, during use, one or more dies or other electronic components may be coupled to the conductive contacts 135, and the conductive contacts 125 may be coupled to a package substrate, circuit board, or other component (e.g., as discussed below with reference to FIG. 11). In some embodiments, a solder resist (not shown) may be disposed around the conductive contacts 125.

A number of examples of IC package supports 100 are disclosed herein, as are various manufacturing techniques for fabricating such IC package supports 100. Any of the features discussed with reference to any of the following figures herein may be combined with any other features to form an IC package support 100. For example, as discussed further below, FIG. 3 illustrates an embodiment in which a solder resist 138 is disposed between a portion of a pad 142 and a dielectric material 102, and FIG. 4 illustrates an embodiment in which a pillar via 146 is included in the transition portion 145. These features of FIGS. 3 and 4 may be combined so that an IC package support 100 includes a solder resist 138 disposed between a portion of a pad 142 and a dielectric material 102, and a pillar via 146 is included in the transition portion 145. This particular combination is simply an example, and any combination may be used. A number of elements of various ones of the accompanying figures are shared with others of the accompanying figures; for ease of discussion, a description of these elements is not repeated, and these elements may take the form of any of the embodiments disclosed herein.

Figure 2A:
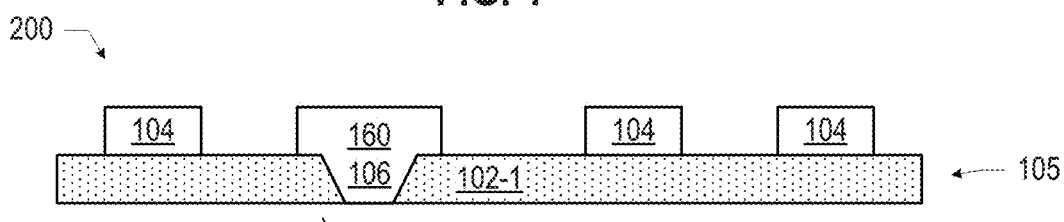
FIGS. 2A-2V illustrate stages in an example process of manufacturing an IC package support, in accordance with various embodiments.
Figure 2B:
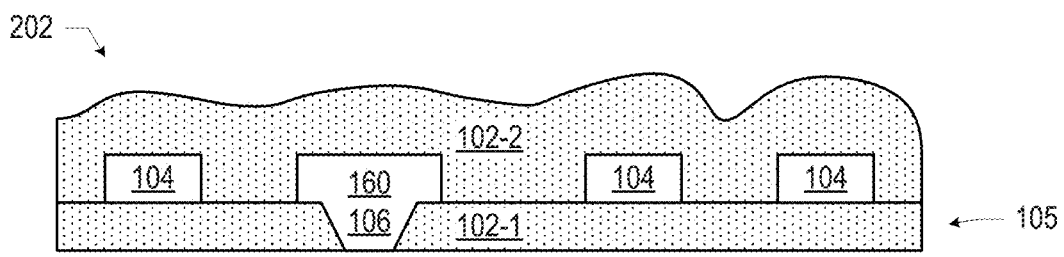
Figure 2C:
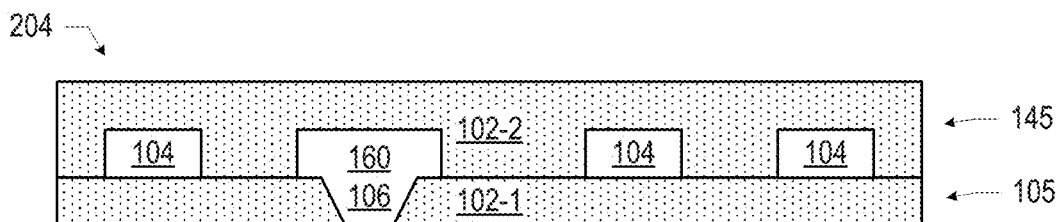
Figure 2D:
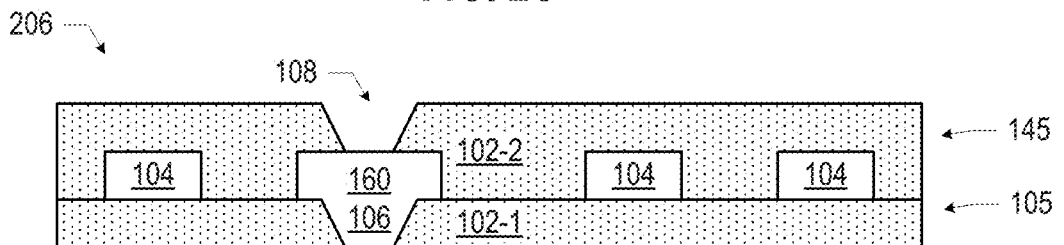
Figure 2E:
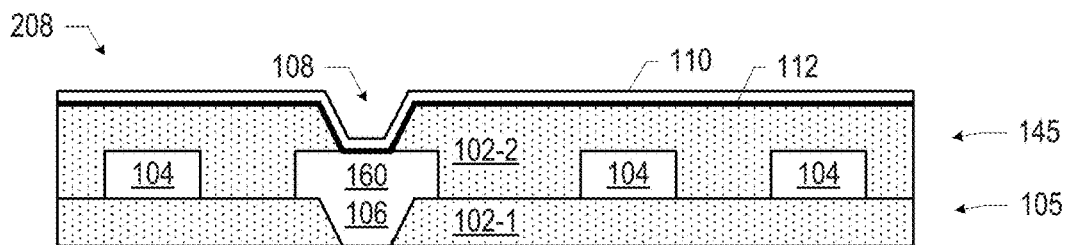
Figure 2F:
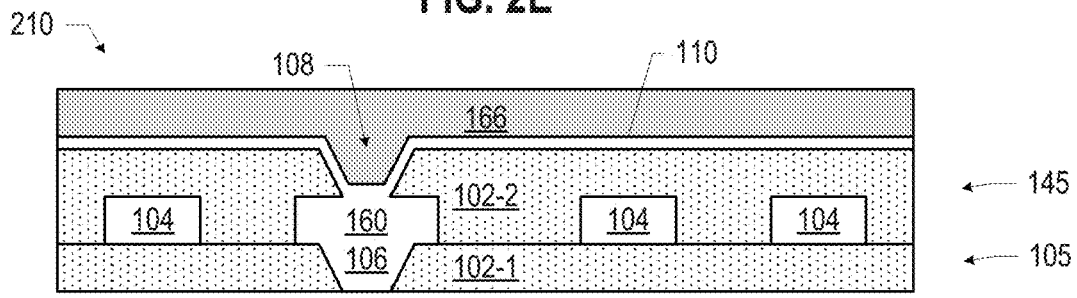
Figure 2G:
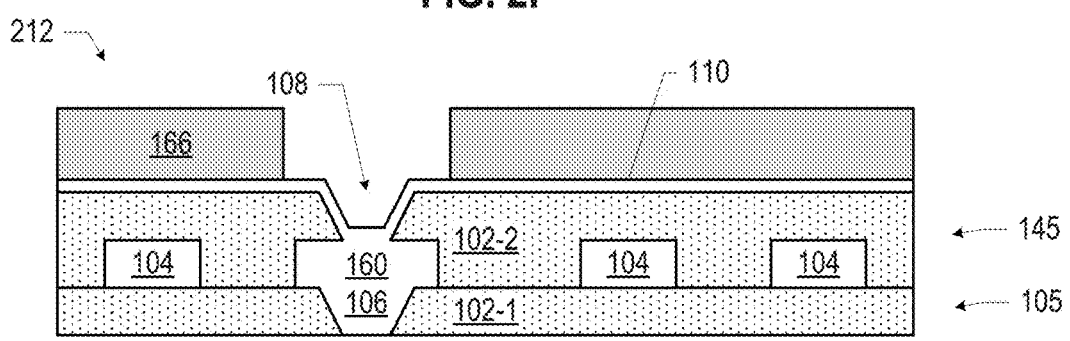
Figure 2H:
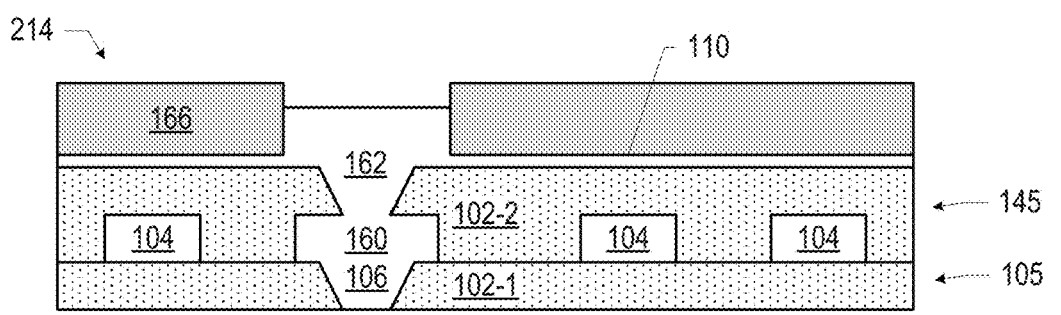
Figure 2I:
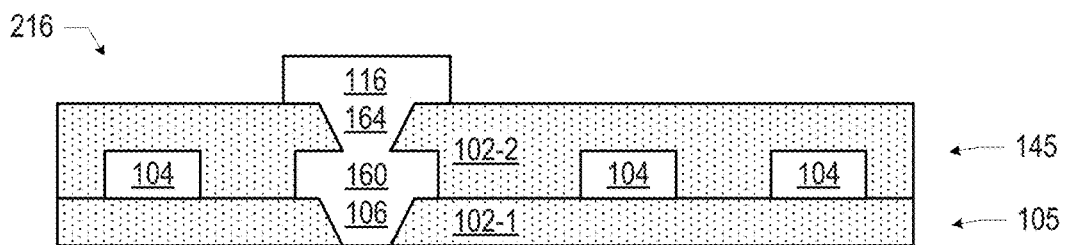
Figure 2J:
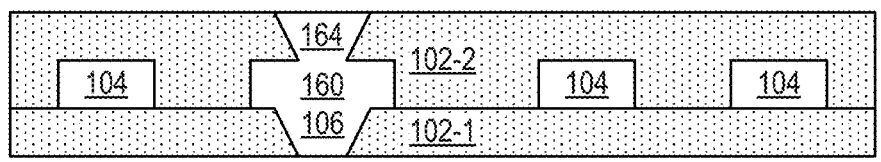
Figure 2K:
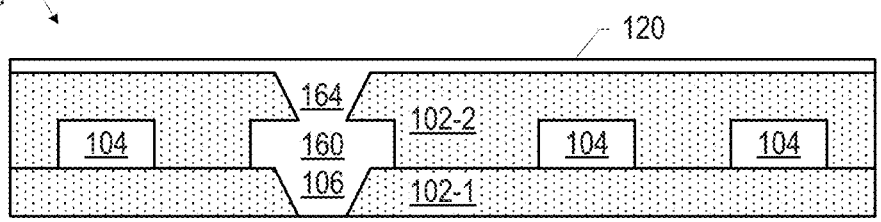
Figure 2L:
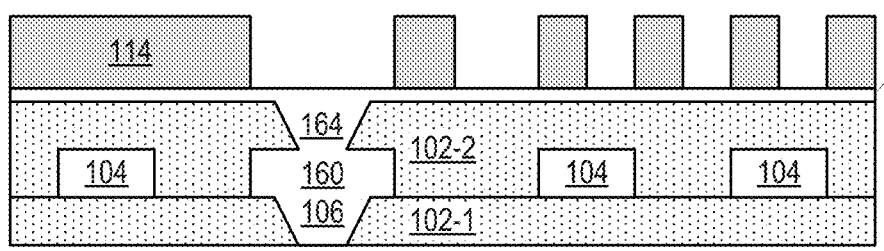
Figure 2M:
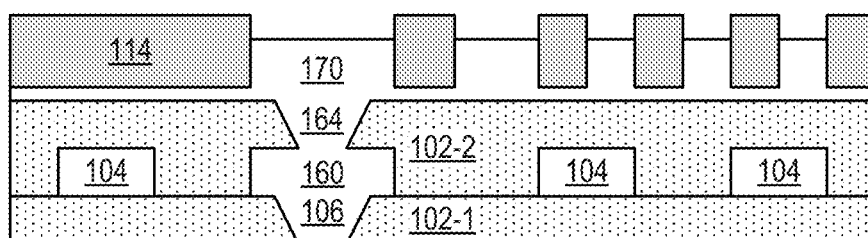
Figure 2N:
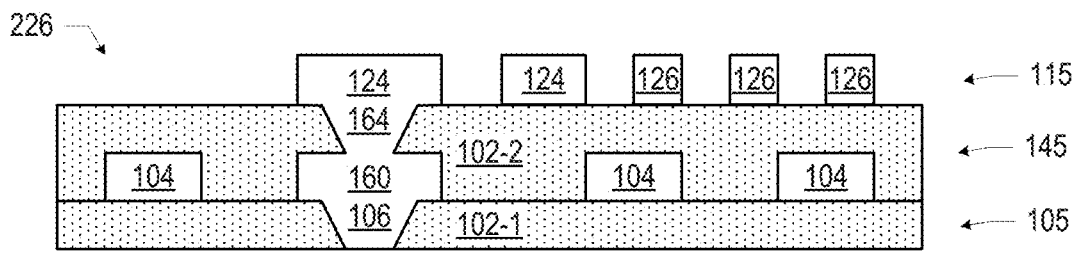
Figure 2O:
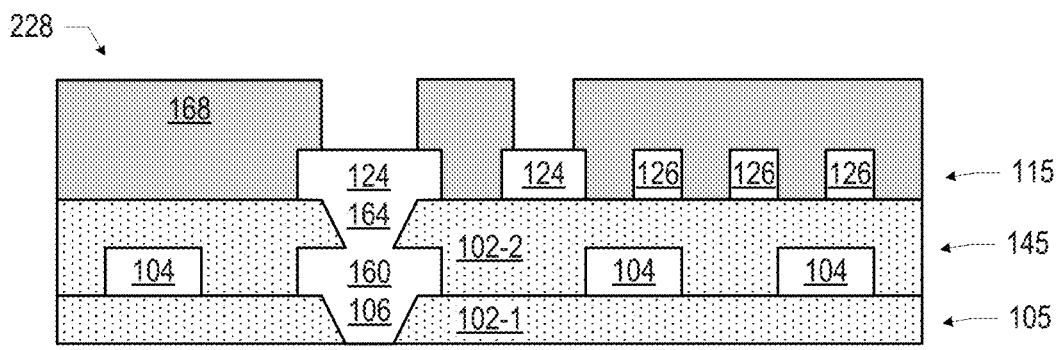
Figure 2P:
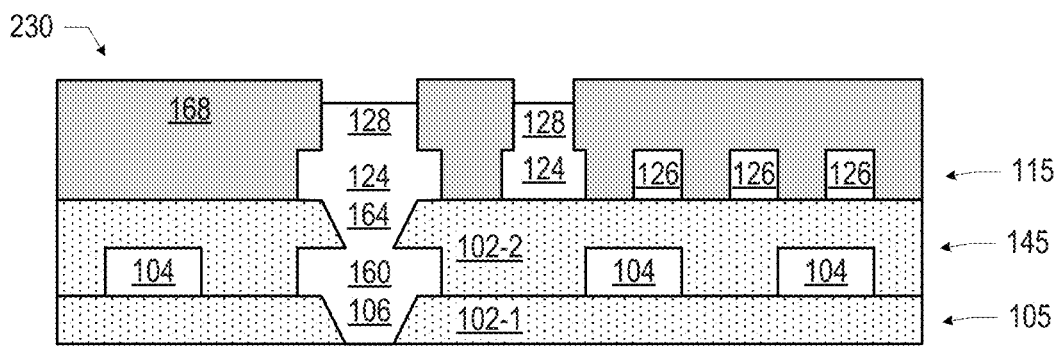
Figure 2Q:
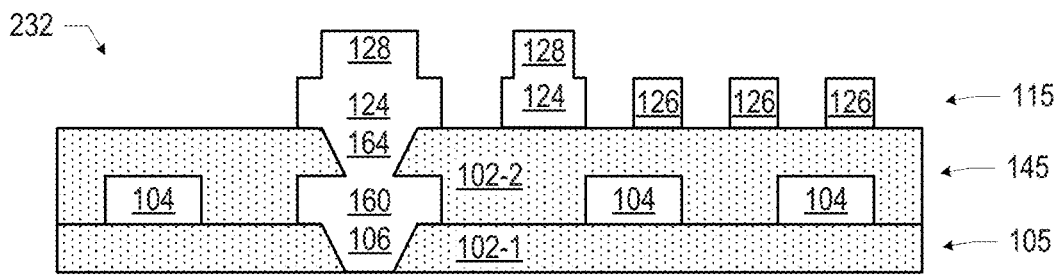
Figure 2R:
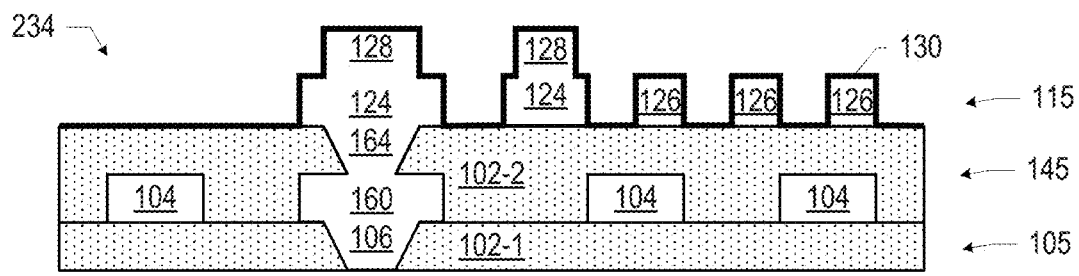
Figure 2S:
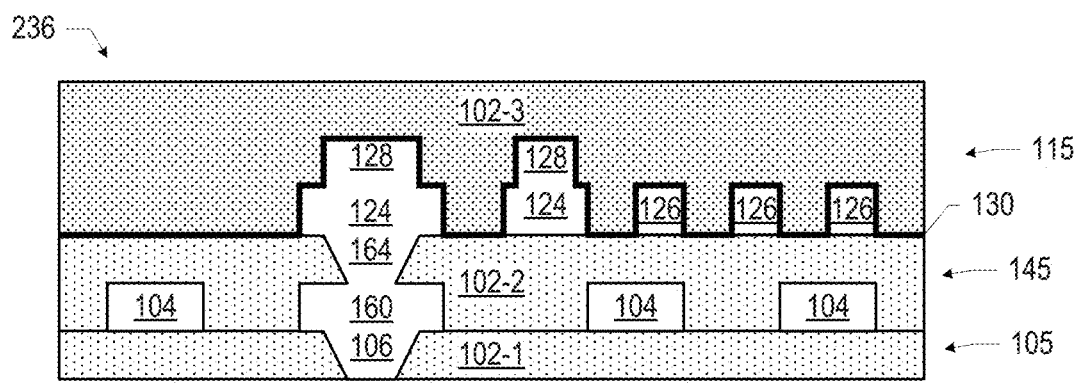
Figure 2T:
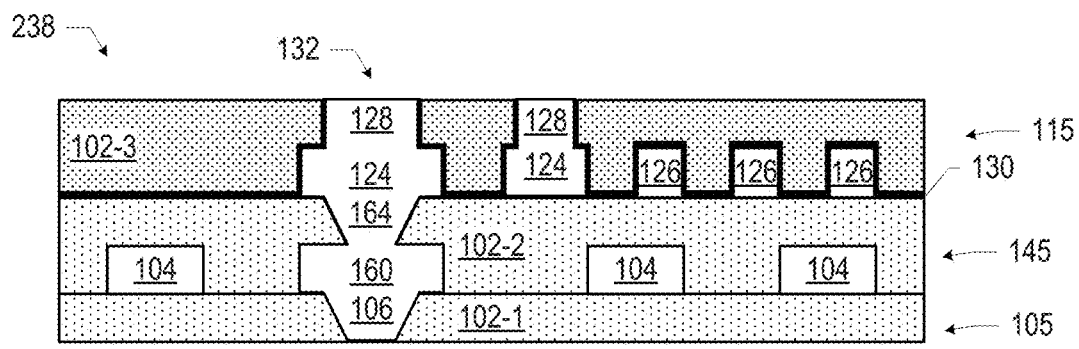
Figure 2U:
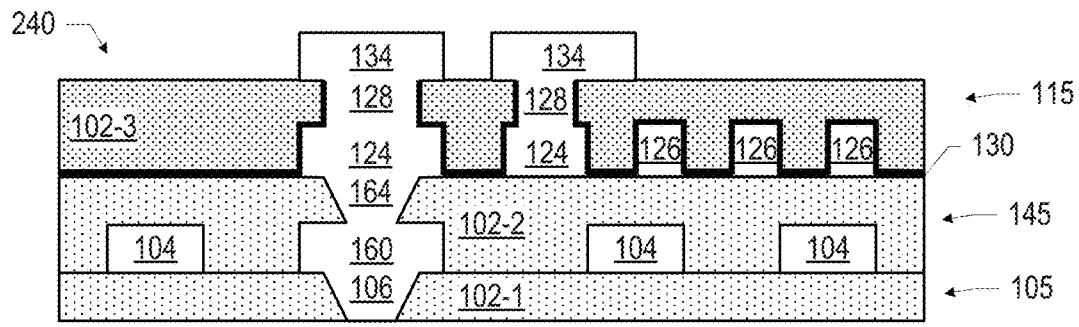
Figure 2V:
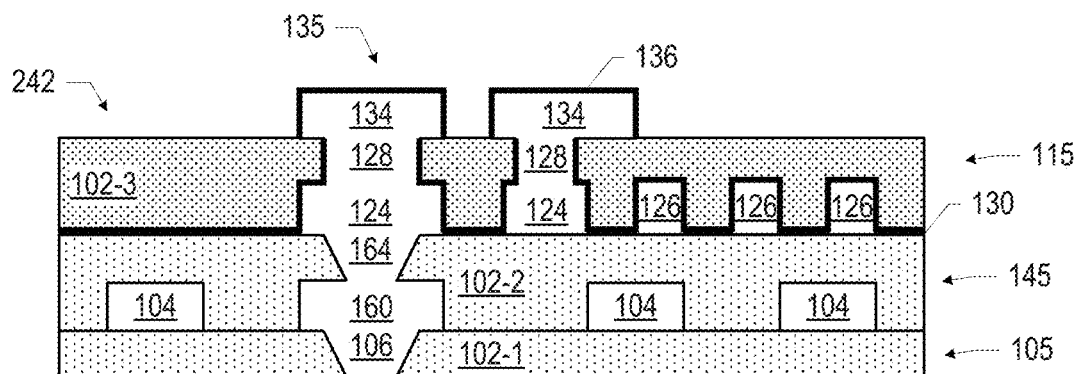

FIGS. 2A-2V illustrate stages in an example process of manufacturing an example IC package support 100, in accordance with various embodiments. Although the operations of FIG. 2 (and others of the accompanying figures) may be illustrated with reference to particular embodiments of the IC package supports 100 disclosed herein, the method may be used to form any suitable IC package supports 100. Operations are illustrated once each and in a particular order in FIG. 2 (and others of the accompanying figures), but the operations may be reordered and/or repeated as desired (e.g., with different operations performed in parallel when manufacturing multiple IC package supports 100 simultaneously).

FIG. 2A illustrates an assembly 200 including a coarse line space portion 105. Only the "top" of the coarse line space portion 105 is illustrated in FIG. 2 (and others of the accompanying drawings) for ease of illustration; the coarse line space portion 105 may include additional layers and features that are not shown. For example, in some embodiments, the coarse line space portion 105 may include a core on which multiple build-up layers are formed, and through which conductive pathways extend. In some embodiments, the conductive contacts 125 may be formed on the first face 155 of the coarse line space portion 105 prior to the operations discussed with reference to FIG. 2 (and others of the accompanying drawings); in other embodiments, the conductive contacts 125 may be formed after the operations discussed with reference to FIG. 2 (and others of the accompanying drawings). For example, the coarse line space portion 105 may be fabricated (e.g., using a cored substrate process flow), and then the face of the coarse line space portion 105 on which the transition portion 145 will be disposed may be covered with a first temporary protective film (e.g., by lamination) while solder resist and surface finish operations are performed on the first face 155 to form the conductive contacts 125; after the solder resist and surface finish operations are performed on the first face 155, the first face 155 may be covered with a second temporary protective film, the first temporary film may be removed, and the operations discussed below may be performed on the newly exposed face of the coarse line space portion 105.

The coarse line space portion 105 of the assembly 200 includes a tapered via 106 through a dielectric material 102-1 and a conductive pad (referred to herein as a "pad") 160 on the top surface of the dielectric material 102-1 and in electrical contact with the tapered via 106. Lines 104 are also disposed on the top surface of the dielectric material 102-1. Although various structures may be referred to herein as "pads" and "lines," in some embodiments, pads (on which a via "lands") may be portions of lines, and lines may also serve as pads. Although a particular number and arrangement of tapered vias 106, pads 160, and lines 104 is shown in FIG. 2A, this arrangement is simply for illustration, and any IC package support 100 may include any suitable arrangement; more generally, although the accompanying drawings illustrate a particular number and arrangement of features (e.g., vias, pads, lines), these arrangements are simply illustrative, and the IC package support 100 may include any suitable arrangement. The conductive vias, lines, and pads disclosed herein may include any suitable conductive materials, such as metals (e.g., copper).

As used herein, a "tapered via" may refer to a conductive via having sidewalls that taper at an angle $\theta$ that is less than 85 degrees (e.g., less than 80 degrees, or between 70 degrees and 80 degrees). Also discussed below are "pillar vias" which may also have sidewalls that taper, but at an angle $\theta$ that is greater than 80 degrees (e.g., between 85 degrees and 90 degrees). In some embodiments, a tapered via may be formed by laser drilling and a pillar via may be formed by photolithography. In some embodiments, a tapered via may have a maximum diameter (referred to herein as a "diameter") that is greater than 20 microns; for example, a tapered via formed by drilling with a carbon dioxide laser may have a diameter that is greater than 40 microns (e.g., between 40 microns and 50 microns), and a tapered via formed by drilling with an ultraviolet laser may have a diameter that is greater than 20 microns (e.g., between 20 microns and 25 microns). A pillar via may have a maximum diameter that is less than 20 microns (e.g., between 2 microns and 20 microns, between 2 microns and 15 microns, or between 2 microns and 10 microns).

The dielectric material 102-1 of the assembly 200 may be a build-up material, such as a build-up film. In some embodiments, the dielectric material 102-1 may be an epoxy material having filler particles therein. For example, the filler particles may be silica, and may have a substantially spherical shape. The top surface of the dielectric material 102-1 may not be planarized prior to formation of the pad 160 and the lines 104, and thus the top surface of the dielectric material 102-1 may exhibit variation due to the manufacturing technique used to deposit the dielectric material 102-1. For example, in some embodiments, the dielectric material 102-1 may be laminated.

FIG. 2B illustrates an assembly 202 subsequent to providing a dielectric material 102-2 on the assembly 200 (FIG. 2A). In some embodiments, the dielectric material 102-2 may be laminated onto the assembly 200, covering the pad 160 and the lines 104. The dielectric material 102-2 may have a same material composition as the dielectric material 102-1, or may have a different material composition. For example, in some embodiments in which the dielectric material 102-1 has silica filler particles with a particular diameter, the dielectric material 102-2 may have silica filler particles with a smaller diameter, allowing for a closer packing. For example, the dielectric material 102-1 may have silica filler particles with a diameter that is greater than 1 micron (e.g., between 1 micron and 5 microns), and the dielectric material 102-2 (or the dielectric material 102-3, discussed below) may have silica filler particles with a diameter that is less than 1 micron (e.g., between 100 nanometers and 500 nanometers).

In some embodiments, the dielectric material 102-2 may be non-photoimageable. As used herein, a "photoimageable material" refers to a material that includes photocatalytic components that cross-link or render the material soluble when exposed to appropriate illumination. The dielectric material 102-2 may not include such photocatalytic components. Some photoimageable materials include polyamides or siloxanes; in some embodiments, the dielectric material 102-2 may not include such components. Some photoimageable materials used in conventional IC packaging (e.g., those capable of supporting suitably small vias) may have a coefficient of thermal expansion (CTE) that is greater than 20 parts per million (e.g., 40 or more parts per million). In some embodiments, the dielectric material 102-2 may have a CTE that is less than 20 parts per million. Some photoimageable materials used in conventional IC packaging may have a loss tangent that is greater than 0.005 (e.g., 0.02 or greater). In some embodiments, the dielectric material 102-2 may have a loss tangent that is less than 0.005.

FIG. 2C illustrates an assembly 204 subsequent to planarizing the top surface of the dielectric material 102-2 of the assembly 202 (FIG. 2B). In some embodiments, the top surface of the dielectric material 102-2 may be planarized using a chemical mechanical planarization (CMP) technique. The planarization of the top surface of the dielectric material 102-2 may achieve the flatness required for the subsequent fabrication of high-density interconnects; without an adequately flat surface on which to build such high-density interconnects, bridging and misalignment may compromise the performance of the resulting interconnects. Some conventional IC packaging techniques may include a planarization operation, but these techniques typically require the planarization of metal, which is an expensive and time-consuming process. By contrast, the operation illustrated by FIG. 2C does not include the planarization of metal, and may be performed more quickly and at less expense. The dielectric material 102-2, the pad 160, and the lines 104 may be part of the transition portion of the IC package support 100.

FIG. 2D illustrates an assembly 206 subsequent to forming a tapered opening 108 in the dielectric material 102-2 of the assembly 204 (FIG. 2C). A top surface of the pad 160 may be exposed at the bottom of the tapered opening 108. The tapered opening 108 may be formed by laser drilling, and may have dimensions in accordance with any of the embodiments discussed above with reference to tapered vias.

FIG. 2E illustrates an assembly 208 subsequent to performing a desmear operation (e.g., a plasma desmear) on the assembly 206 (FIG. 2D), forming a layer of an adhesion promoter material 112, and then forming a seed layer 110 of a conductive material (e.g., copper). The adhesion promoter material 112 may facilitate mechanical adhesion between the seed layer 110 and the dielectric material 102-2. In some embodiments, the adhesion promoter material 112 may include titanium. The seed layer 110 may be formed by electroless deposition, and both the adhesion promoter material 112 and the seed layer 110 may be substantially conformal. The adhesion promoter material 112 is omitted from subsequent drawings for ease of illustration. Conventional photoimageable materials may not be compatible with electroless deposition.

FIG. 2F illustrates an assembly 210 subsequent to depositing a photoresist 166 on the seed layer 110 of the assembly 208 (FIG. 2E). The photoresist 166 may be deposited using any suitable technique (e.g., spin-on deposition or lamination).

FIG. 2G illustrates an assembly 212 subsequent to patterning the photoresist 166 of the assembly 210 (FIG. 2F) to expose an area around the tapered opening 108. The photoresist 166 may be patterned using any suitable lithographic technique (e.g., exposing the photoresist 166 with a mask to change the solubility of different portions of the photoresist 166 and then etching away the more soluble portions, as known in the art).

FIG. 2H illustrates an assembly 214 subsequent to depositing conductive material 162 (e.g., metal) in the tapered opening 108 on the seed layer 110 of the assembly 212 (FIG. 2G). The conductive material 162 may be formed by electroplating on the seed layer 110. The top surface of the conductive material 162 may be recessed below the top surface of the photoresist 166, as shown in FIG. 2H.

FIG. 2I illustrates an assembly 216 subsequent to stripping the photoresist 166 from the assembly 214 (FIG. 2H) and then performing a brief selective etch to remove the seed layer 110 (and some of the conductive material 162). The remaining conductive material 162 may provide a tapered via 164 and a pad 116. The pad 116 may extend onto the planarized surface of the dielectric material 102-2.

FIG. 2J illustrates an assembly 218 subsequent to removing the pad 116 from the assembly 216 (FIG. 2I). The pad 116 may be removed by a timed copper etch, for example; such an etch may leave a top surface of the tapered via 164 fairly rough. In some embodiments, CMP may be performed to remove the pad 116, but such an operation may incur additional time and expense.

FIG. 2K illustrates an assembly 220 subsequent to forming a seed layer 120 of a conductive material (e.g., copper) on the assembly 218 (FIG. 2J). In some embodiments, the seed layer 120 may be formed by sputtering, and in such embodiments, the seed layer 120 may be thinner than the seed layer 110 discussed above with reference to FIG. 2E. As also discussed above with reference to FIG. 2E, an adhesion promoter material (not shown) may be deposited on the assembly 218 before forming the seed layer 120; in some embodiments, that adhesion promoter material may include titanium.

FIG. 2L illustrates an assembly 222 subsequent to depositing and patterning a photoresist 114 on the seed layer 120 of the assembly 220 (FIG. 2K). The photoresist 114 may be patterned with openings to selectively expose portions of the seed layer 120 in accordance with any techniques known in the art.

FIG. 2M illustrates an assembly 224 subsequent to depositing conductive material 170 (e.g., metal) on the seed layer 120 in the openings of the photoresist 114 of the assembly 222 (FIG. 2L). The conductive material 170 may be formed by electroplating on the seed layer 120. The top surface of the conductive material 170 may be recessed below the top surface of the photoresist 114, as shown in FIG. 2M.

FIG. 2N illustrates an assembly 226 subsequent to stripping the photoresist 114 from the assembly 224 (FIG. 2M) and then performing a brief selective etch to remove the seed layer 120 (and some of the conductive material 170). The remaining conductive material 170 may provide pads 124 and lines 126. The pads 124 and lines 126 may be at least partially (or entirely) on the planarized surface of the dielectric material 102-2. The pads 124 and lines 126 may be part of the fine line space portion 115 of the IC package support 100. One of the pads 124 may be in electrical contact with the tapered via 164, as shown.

FIG. 2O illustrates an assembly 228 subsequent to depositing and patterning a photoresist 168 on the assembly 226 (FIG. 2N). The photoresist 168 may be patterned with openings to selectively expose the pads 124 of the assembly 226 in accordance with any techniques known in the art.

FIG. 2P illustrates an assembly 230 subsequent to depositing conductive material (e.g., metal) in the openings of the photoresist 168 of the assembly 228 (FIG. 2O) to form pillar vias 128 in electrical contact with the pads 124. The pillar vias 128 may take the form of any of the pillar vias discussed above.

FIG. 2Q illustrates an assembly 232 subsequent to stripping the photoresist 168 from the assembly 230 (FIG. 2P).

FIG. 2R illustrates an assembly 234 subsequent to forming a layer of adhesion promoter material 130 on the assembly 232 (FIG. 2Q). The adhesion promoter material 130 may include silicon nitride, silicon oxide, silicon oxynitride, an organic adhesion promoter, or any other suitable material. In some embodiments, the adhesion promoter material 130 may be deposited by plasma enhanced chemical vapor deposition (PECVD). The presence of such adhesion promoter material 130 on sidewalls of features in a package substrate or interposer may not be achievable using conventional techniques.

FIG. 2S illustrates an assembly 236 subsequent to forming a dielectric material 102-3 on the adhesive promoter material 130 of the assembly 234 (FIG. 2R). In some embodiments, the dielectric material 102-3 may be laminated onto the assembly 234. The dielectric material 102-3 may have a same material composition as the dielectric material 102-2 (or the dielectric material 102-1), or may have a different material composition. For example, in some embodiments in which the dielectric material 102-1 or the dielectric material 102-2 has silica filler particles with a particular diameter, the dielectric material 102-3 may have silica filler particles with a smaller diameter.

FIG. 2T illustrates an assembly 238 subsequent to removing the dielectric material 102-3 above the pillar vias 128 of the assembly 236 (FIG. 2S), and also to removing the adhesion promoter material 130 from the top faces of the pillar vias 128. The dielectric material 102-3 and adhesion promoter material 130 may be removed using plasma etching or mechanical grinding or polishing, for example. Adhesion promoter material 130 may remain on the sidewalls of the pillar vias 128, the side faces of the pads 124 and lines 126, and on portions of the top surface of the dielectric material 102-2, as shown. The material of the pillar vias 128 may be exposed (or "revealed") in the assembly 238. The operations of FIGS. 2K-2T may be repeated as desired to form multiple layers of features in the fine line space portion 115. In some embodiments, each layer of features in the fine line space portion 115 may have a height of approximately 5 microns.

FIG. 2U illustrates an assembly 240 subsequent to repeating the operations described above with reference to FIGS. 2K-2N on the assembly 238 (FIG. 2T) to form pads 134 in conductive contact with the pillar vias 128. The pads 134 may be at least partially over the top surface of the dielectric material 102-3.

FIG. 2V illustrates an assembly 242 subsequent to depositing an organic solderable preservative (OSP) 136 on the pads 134 of the assembly 240 (FIG. 2U). For example, when the pads 134 include copper, the OSP 136 may be a copper OSP. In some embodiments, the pads 134 may be the conductive contacts 135 of an IC package support 100.

Figure 3A:
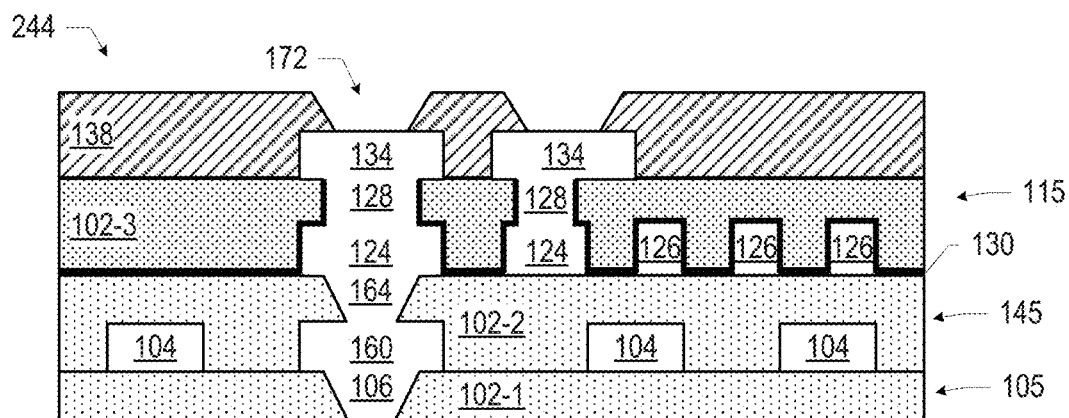
FIGS. 3A-3C illustrate stages in an example process of manufacturing an IC package support, in accordance with various embodiments.
Figure 3B:
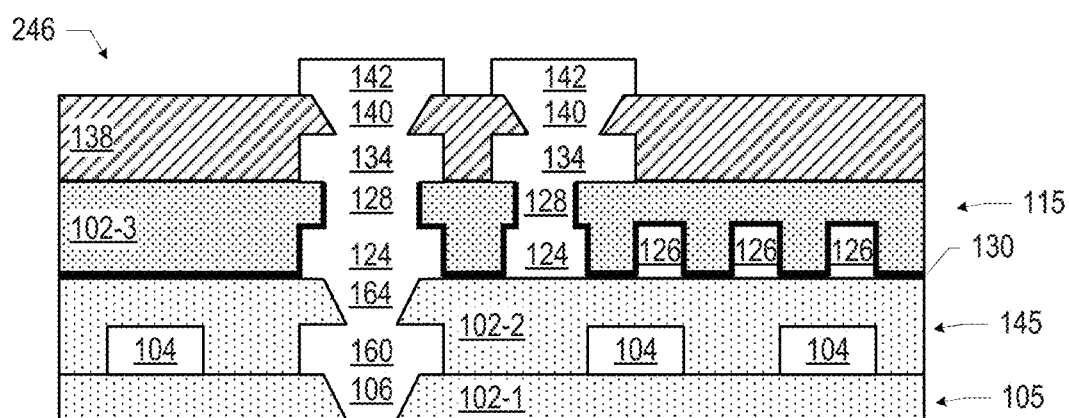
Figure 3C:
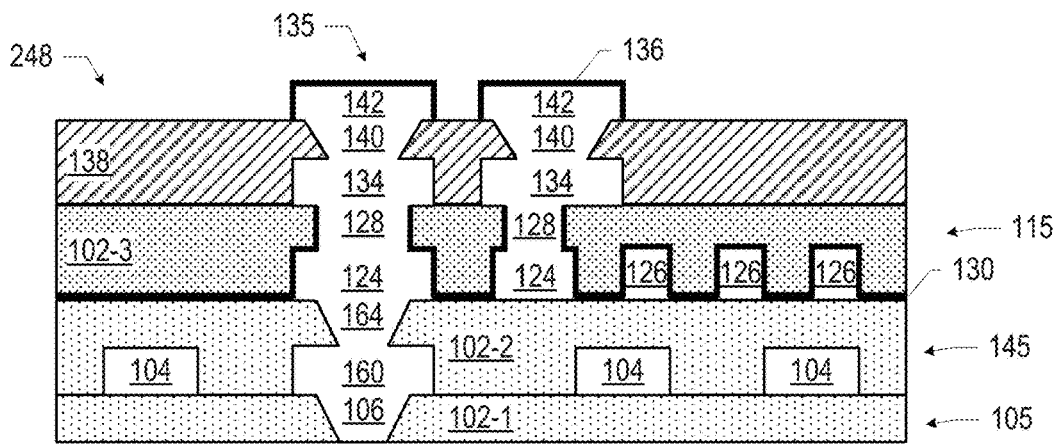

In some embodiments of the IC package supports 100 disclosed herein, a solder resist may be disposed around the conductive contacts 135. FIGS. 3A-3C illustrate stages in an example process of manufacturing an example of such an IC package support 100, in accordance with various embodiments.

FIG. 3A illustrates an assembly 244 subsequent to depositing a solder resist 138 on the assembly 240 of FIG. 2U, and then forming openings 172 in the solder resist 138 to expose portions of the top surface of the pads 134.

FIG. 3B illustrates an assembly 246 subsequent to repeating the operations described above with reference to FIGS. 1E-11 on the assembly 244 (FIG. 3A) to form vias 140 in conductive contact with the pads 134, and pads 142 in conductive contact with the vias 140. The pads 142 may be at least partially over the solder resist 138.

FIG. 3C illustrates an assembly 248 subsequent to depositing an OSP 136 on the pads 142 of the assembly 246 (FIG. 3B). In some embodiments, the pads 142 may be the conductive contacts 135 of an IC package support 100.

In some embodiments, a via included in the transition portion 145 of an IC package support 100 may be a pillar via (e.g., in contrast to the embodiments of FIGS. 2 and 3, which illustrate a tapered via 164 in the transition portion 145). FIGS. 4A-4E illustrate stages in an example process of manufacturing an example of such an IC package support 100, in accordance with various embodiments. The process of FIG. 4 may reduce the amount of metal etch required relative to the process of FIG. 2, and may not involve a desmear operation (which may roughen the surface of the dielectric material 102-1).

Figure 4A:
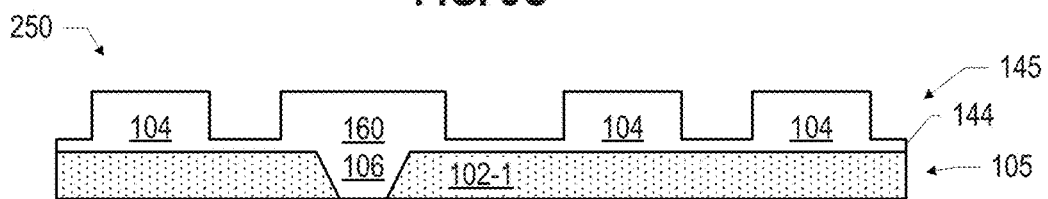
FIGS. 4A-4E illustrate stages in an example process of manufacturing an IC package support, in accordance with various embodiments.

FIG. 4A illustrates an assembly 250 subsequent to forming a seed layer 144 of a conductive material on the assembly 200 of FIG. 2A. The seed layer 144 may be formed by sputtering, for example.

Figure 4B:
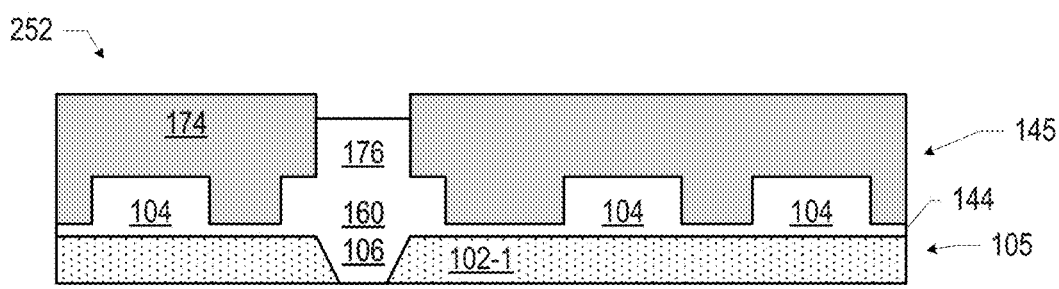

FIG. 4B illustrates an assembly 252 subsequent to depositing a photoresist 174 on the assembly 250 (FIG. 4A), patterning the photoresist 174 to create an opening to expose a portion of a top surface of the pad 160, and forming a conductive material 176 in the opening (in electrical contact with the pad 160). The conductive material 176 may be formed by electroplating on the seed layer 144. The top surface of the conductive material 176 may be recessed below the top surface of the photoresist 174, as shown in FIG. 4B.

Figure 4C:
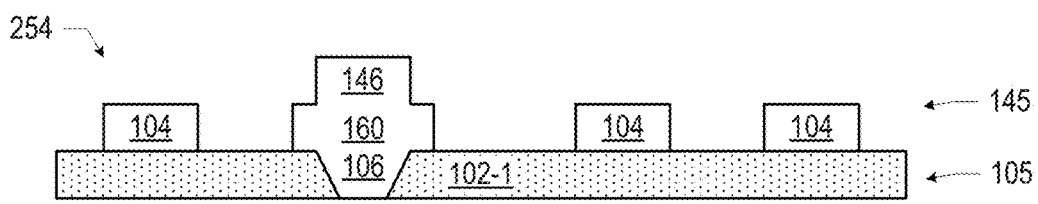

FIG. 4C illustrates an assembly 254 subsequent to stripping the photoresist 174 from the assembly 252 (FIG. 4B) and then performing a brief selective etch to remove the seed layer 144 (and some of the conductive material 176). The remaining conductive material 176 may provide a pillar via 146 in conductive contact with the pad 160.

Figure 4D:
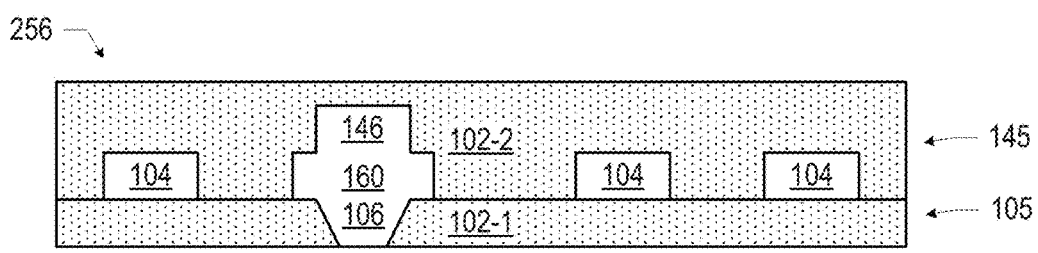

FIG. 4D illustrates an assembly 234 subsequent to forming a layer of adhesion promoter material 130 on the assembly 232 (FIG. 2Q). The adhesion promoter material 130 may include silicon nitride, silicon oxide, silicon oxynitride, an organic adhesion promoter, or any other suitable material. In some embodiments, the adhesion promoter material 130 may be deposited by PECVD.

FIG. 4D illustrates an assembly 256 subsequent to forming a dielectric material 102-2 on the assembly 254 (FIG. 4C). In some embodiments, a layer of adhesion promoter material (not shown) may be deposited on the assembly 254 prior to forming the dielectric material 102-2 (e.g., in accordance with any of the embodiments discussed above with reference to the adhesion promoter material 130). In some embodiments, the dielectric material 102-2 may be laminated onto the assembly 254. As noted above, the dielectric material 102-2 may have a same material composition as the dielectric material 102-1 or may have a different material composition.

Figure 4E:
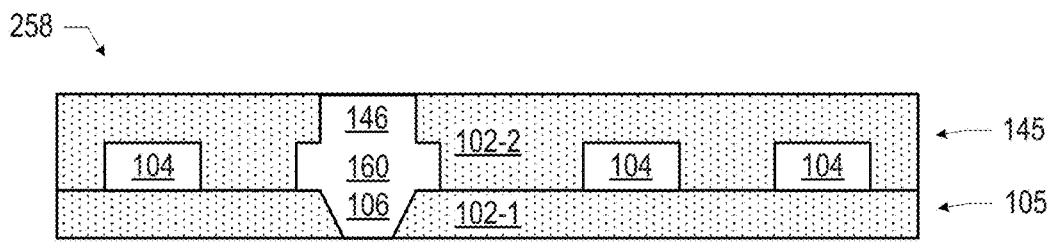

FIG. 4E illustrates an assembly 258 subsequent to performing a planarization on the assembly 256 (FIG. 4D) to remove the dielectric material 102-2 above the pillar vias 128 (and also to remove any adhesion promoter material, not shown, from the top faces of the pillar vias 128). The material of the pillar vias 128 may be exposed in the assembly 258. Processing of the assembly 258 may continue as discussed above with reference to the assembly 220 of FIG. 2K.

Figure 5A:
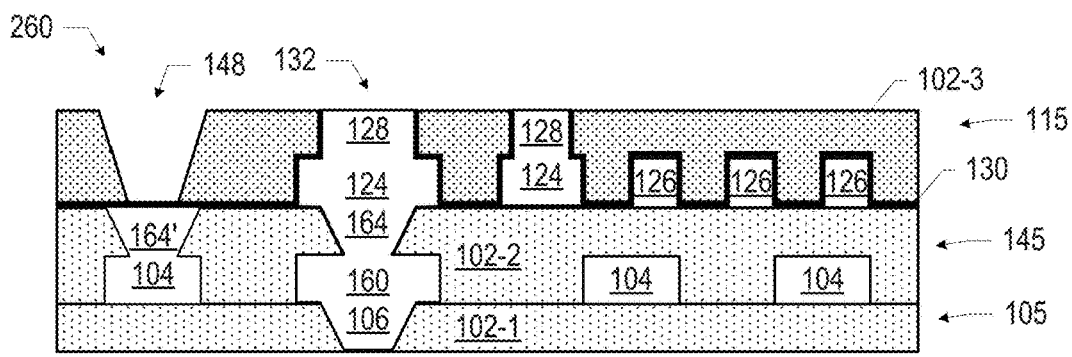
FIGS. 5A-5C illustrate stages in an example process of manufacturing an IC package support, in accordance with various embodiments.
Figure 5B:
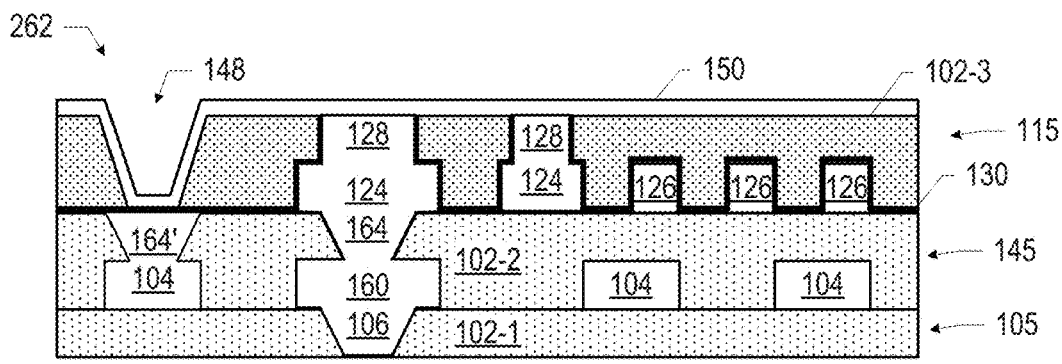
Figure 5C:
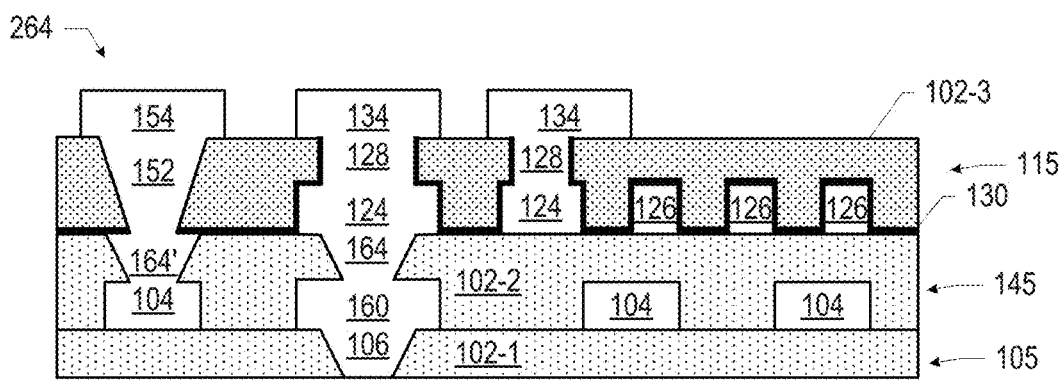

In some embodiments, the fine line space portion 115 of an IC package support 100 may include a via that extends between a conductive contact 135 at the second face 165 and the transition portion 145. Such a via may allow a "direct" connection to be made between the conductive contact 135 and conductive pathways in the coarse line space portion 105. FIGS. 5A-5C illustrate stages in an example process of manufacturing an example of such an IC package support 100, in accordance with various embodiments.

FIG. 5A illustrates an assembly 260 subsequent to forming a tapered opening 148 through the dielectric material 102-3 of an assembly substantially similar to the assembly 238 of FIG. 2T but that also includes an additional tapered via 164'. A top surface of the tapered via 164' may be exposed at the bottom of the tapered opening 148. The tapered opening 148 may be formed by laser drilling, and may have dimensions in accordance with any of the embodiments discussed above with reference to tapered vias. In some embodiments, the fine line space portion 115 may include 3-5 layers of vias/lines, and may have a total thickness of approximately 20 microns; such a thickness may be drilled through using conventional laser drilling techniques.

FIG. 5B illustrates an assembly 262 subsequent to performing a desmear operation (e.g., a plasma desmear) on the assembly 260 (FIG. 5A), forming a layer of an adhesion promoter material (not shown, but which may take the form of the adhesion promoter material 112 discussed above)), and then forming a seed layer 150 of a conductive material (e.g., copper). The seed layer 150 may be formed by electroless deposition, for example. The adhesion promoter material 112 is omitted from subsequent drawings for ease of illustration.

FIG. 5C illustrates an assembly 264 subsequent to repeating the operations described above with reference to FIGS. 1F-11 on the assembly 262 (FIG. 5B) to form a tapered via 152 in conductive contact with the tapered via 164', and a pad 154 in conductive contact with the tapered via 152. The pad 154 may be at least partially over the dielectric material 102-3. Processing of the assembly 264 may continue as discussed above with reference to FIG. 2V or FIGS. 3A-3C.

In some embodiments, pillar vias, lines, and pads in the fine line space portion 115 may be formed using self-aligned techniques. In some such embodiments, the width of a pillar via and the pad (e.g., a line) on which it lands may be the same. FIGS. 6A-6C, 7A-7C, and 8A-8C illustrate stages in an example process of manufacturing an IC package support 100 using self-aligned techniques, in accordance with various embodiments. In particular, the "A" sub-figures represent top views of various assemblies, the "B" sub-figures represent cross-sectional side views through the B-B sections of the "A" sub-figures, and the "C" sub-figures represent cross-sectional side views through the C-C sections of the "A" sub-figures. The self-aligned structures that may be manufactured using the operations illustrated in FIGS. 6-8 may improve the reliability of stacked features (e.g., vias on lines) by reducing misalignment relative to "sequential" photoresist techniques, but may result in a decreased interconnect density relative to such techniques.

FIG. 6 illustrates an assembly 266 including a seed layer 156 on a dielectric material 102. The dielectric material 102 of the assembly 266 may be any of the dielectric materials disclosed herein (e.g., the dielectric material 102-2 or the dielectric material 102-3). The seed layer 156 may be a seed layer of a conductive material (e.g., copper). An adhesion promoter material (not shown) may be disposed between the seed layer 156 and the dielectric material 102.

FIG. 7 illustrates an assembly 268 subsequent to depositing a photoresist 178 on the seed layer 156 of the assembly 266 (FIG. 6), patterning the photoresist 178, and forming a conductive material 158 on the seed layer 156 and in the openings of the patterned photoresist 178. These operations may take the form of any of the embodiments discussed above with reference to FIGS. 2L-2M, for example.

FIG. 8 illustrates an assembly 270 subsequent to depositing another photoresist 180 on the assembly 268 (FIG. 7), and patterning the photoresist 180. The photoresist 180 may be deposited before stripping the photoresist 178, as shown in FIG. 8. The patterned photoresist 180 may include openings to selectively expose some of the conductive material 158. Processing of the assembly 268 may continue by depositing additional conductive material 158 in the openings of the patterned photoresist 180, then stripping the photoresist 180 and the photoresist 178. The resulting structure may include both pillar vias (e.g., corresponding to the openings in the patterned photoresist 180) and pad/lines (e.g., corresponding to the openings in the patterned photoresist 178, or vice versa). Operations like those discussed above with reference to FIGS. 6-8 may be performed instead of or in addition to sequential photoresist techniques like those discussed herein with reference to FIGS. 2L-2Q.

The IC package supports 100 disclosed herein may be included in any suitable electronic component. FIGS. 9-13 illustrate various examples of apparatuses that may include any of the IC package supports 100 disclosed herein, or may be included in an IC package that also includes any of the IC package supports 100 disclosed herein.

Figure 9:
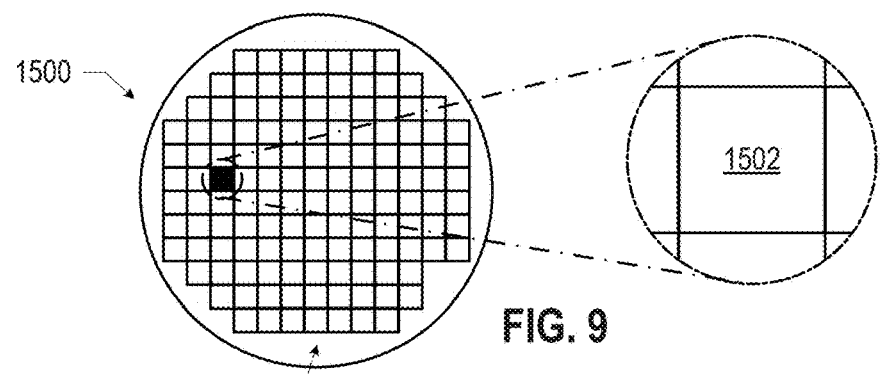
FIG. 9 is a top view of a wafer and dies that may be included in an IC package having an IC package support in accordance with any of the embodiments disclosed herein.

FIG. 9 is a top view of a wafer 1500 and dies 1502 that may be included in an IC package including one or more IC package supports 100 (e.g., as discussed below with reference to FIG. 11) in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 10, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 13) or other logic that is configured to store information in the memory devices or execute instructions stored in the memory array.

Figure 10:
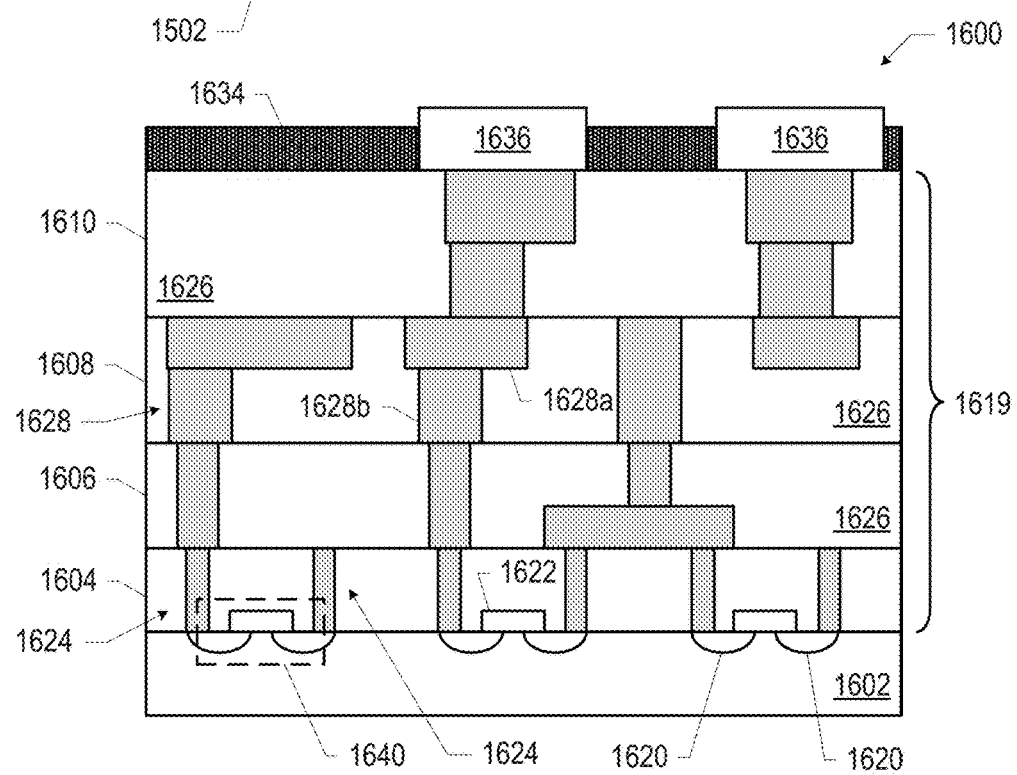
FIG. 10 is a cross-sectional side view of an IC device that may be included in an IC package having an IC package support in accordance with any of the embodiments disclosed herein.

FIG. 10 is a cross-sectional side view of an IC device 1600 that may be included in an IC package including one or more IC package supports 100 (e.g., as discussed below with reference to FIG. 11), in accordance with any of the embodiments disclosed herein. One or more of the IC devices 1600 may be included in one or more dies 1502 (FIG. 9). The IC device 1600 may be formed on a substrate 1602 (e.g., the wafer 1500 of FIG. 9) and may be included in a die (e.g., the die 1502 of FIG. 9). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 9) or a wafer (e.g., the wafer 1500 of FIG. 9).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 10 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 10 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 10). Although a particular number of interconnect layers 1606-1610 is depicted in FIG. 10, embodiments of the present disclosure include IC devices having more or fewer interconnect layers than depicted.

In some embodiments, the interconnect structures 1628 may include lines 1628*a* and/or vias 1628*b* filled with an electrically conductive material such as a metal. The lines 1628*a* may be arranged to route electrical signals in a direction of a plane that is substantially parallel with a surface of the substrate 1602 upon which the device layer 1604 is formed. For example, the lines 1628*a* may route electrical signals in a direction in and out of the page from the perspective of FIG. 10. The vias 1628*b* may be arranged to route electrical signals in a direction of a plane that is substantially perpendicular to the surface of the substrate 1602 upon which the device layer 1604 is formed. In some embodiments, the vias 1628*b* may electrically couple lines 1628*a* of different interconnect layers 1606-1610 together.

The interconnect layers 1606-1610 may include a dielectric material 1626 disposed between the interconnect structures 1628, as shown in FIG. 10. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628*a* and/or vias 1628*b*, as shown. The lines 1628*a* of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628*b* to couple the lines 1628*a* of the second interconnect layer 1608 with the lines 1628*a* of the first interconnect layer 1606. Although the lines 1628*a* and the vias 1628*b* are structurally delineated with a line within each interconnect layer (e.g., within the second interconnect layer 1608) for the sake of clarity, the lines 1628*a* and the vias 1628*b* may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 10, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 11:
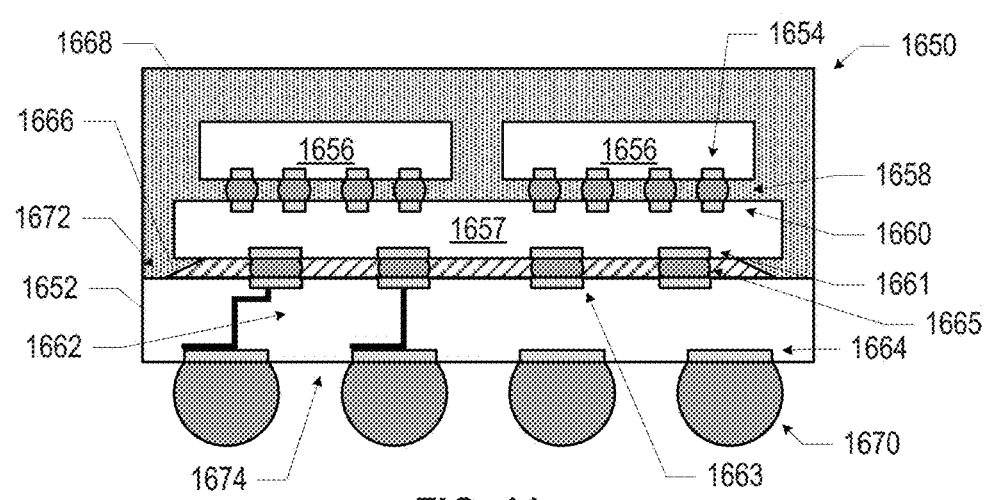
FIG. 11 is a cross-sectional side view of an IC package that may include any of the IC package supports disclosed herein.

FIG. 11 is a cross-sectional side view of an example IC package 1650 that may include one or more IC package supports 100, in accordance with any of the embodiments disclosed herein. For example, the package substrate 1652 and/or the interposer 1657 may be an IC package support 100, in accordance with any of the embodiments disclosed herein. In some embodiments, the IC package 1650 may be a system-in-package (SiP).

The package substrate 1652 may be formed of a dielectric material, and may have conductive pathways extending through the dielectric material between the face 1672 and the face 1674, or between different locations on the face 1672, and/or between different locations on the face 1674. These conductive pathways may take the form of any of the interconnects 1628 discussed above with reference to FIG. 10. The package substrate 1652 may include conductive contacts 1663 that are coupled to conductive pathways 1662 through the package substrate 1652, allowing circuitry within the dies 1656 and/or the interposer 1657 to electrically couple to various ones of the conductive contacts 1664 (or to other devices included in the package substrate 1652, not shown). In embodiments in which the package substrate 1652 is an IC package support 100, the conductive contacts 1663 may be the conductive contacts 135, and the conductive contacts 1664 may be the conductive contacts 125.

The IC package 1650 may include an interposer 1657 coupled to the package substrate 1652 via conductive contacts 1661 of the interposer 1657, first-level interconnects 1665, and the conductive contacts 1663 of the package substrate 1652. The first-level interconnects 1665 illustrated in FIG. 11 are solder bumps, but any suitable first-level interconnects 1665 may be used. In embodiments in which the interposer 1657 is an IC package support 100, the conductive contacts 1660 may be the conductive contacts 135, and the conductive contacts 1661 may be the conductive contacts 125. In some embodiments, no interposer 1657 may be included in the IC package 1650; instead, the dies 1656 may be coupled directly to the conductive contacts 1663 at the face 1672 by first-level interconnects 1665.

The IC package 1650 may include one or more dies 1656 coupled to the interposer 1657 via conductive contacts 1654 of the dies 1656, first-level interconnects 1658, and conductive contacts 1660 of the interposer 1657. The conductive contacts 1660 may be coupled to conductive pathways (not shown) through the interposer 1657, allowing circuitry within the dies 1656 to electrically couple to various ones of the conductive contacts 1661 (or to other devices included in the interposer 1657, not shown). The first-level interconnects 1658 illustrated in FIG. 11 are solder bumps, but any suitable first-level interconnects 1658 may be used.

In some embodiments, an underfill material 1666 may be disposed between the package substrate 1652 and the interposer 1657 around the first-level interconnects 1665, and a mold compound 1668 may be disposed around the dies 1656 and the interposer 1657 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 11 are solder balls (e.g., for a ball grid array arrangement), but any suitable second-level interconnects 16770 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 12.

The dies 1656 may take the form of any of the embodiments of the die 1502 discussed herein (e.g., may include any of the embodiments of the IC device 1600). In embodiments in which the IC package 1650 includes multiple dies 1656, the IC package 1650 may be referred to as a multi-chip package (MCP). The dies 1656 may include circuitry to perform any desired functionality. For example, or more of the dies 1656 may be logic dies (e.g., silicon-based dies), and one or more of the dies 1656 may be memory dies (e.g., high bandwidth memory). In some embodiments, a single logic die 1656 may be electrically coupled to multiple memory dies 1656 through an IC package support 100 (e.g., the interposer 1657 or the package substrate 1652 when the interposer 1657 is not present); the logic die 1656 may communicate with the multiple memory dies 1656 through the fine line space portion 115 of the IC package support 100. The fine line space portion 115 may provide the interconnect density needed to support high bandwidth communications in such an embodiment. In other embodiments, multiple logic dies 1656 may communicate through the fine line space portion 115 of the IC package support 100.

Although the IC package 1650 illustrated in FIG. 11 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although two dies 1656 are illustrated in the IC package 1650 of FIG. 11, an IC package 1650 may include any desired number of dies 1656. An IC package 1650 may include additional passive components, such as surface-mount resistors, capacitors, and inductors disposed on the first face 1672 or the second face 1674 of the package substrate 1652, or on either face of the interposer 1657. More generally, an IC package 1650 may include any other active or passive components known in the art.

Figure 12:
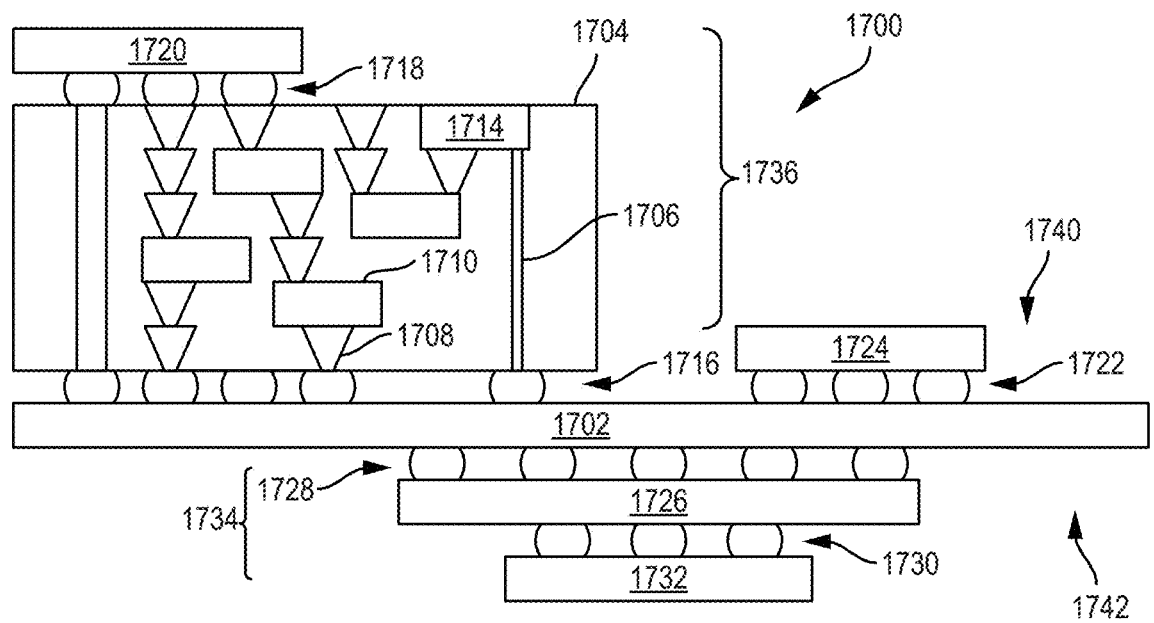
FIG. 12 is a cross-sectional side view of an IC device assembly that may include an IC package support in accordance with any of the embodiments disclosed herein.

FIG. 12 is a cross-sectional side view of an IC device assembly 1700 that may include one or more IC packages including one or more IC package supports 100 in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the IC package 1650 discussed above with reference to FIG. 11 (e.g., may include one or more IC package supports 100 as a package substrate 1652 or an interposer 1657).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 12 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 12), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 12, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 9), an IC device (e.g., the IC device 1600 of FIG. 10), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 12, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal interconnects 1708 and vias 1710, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 12 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 13:
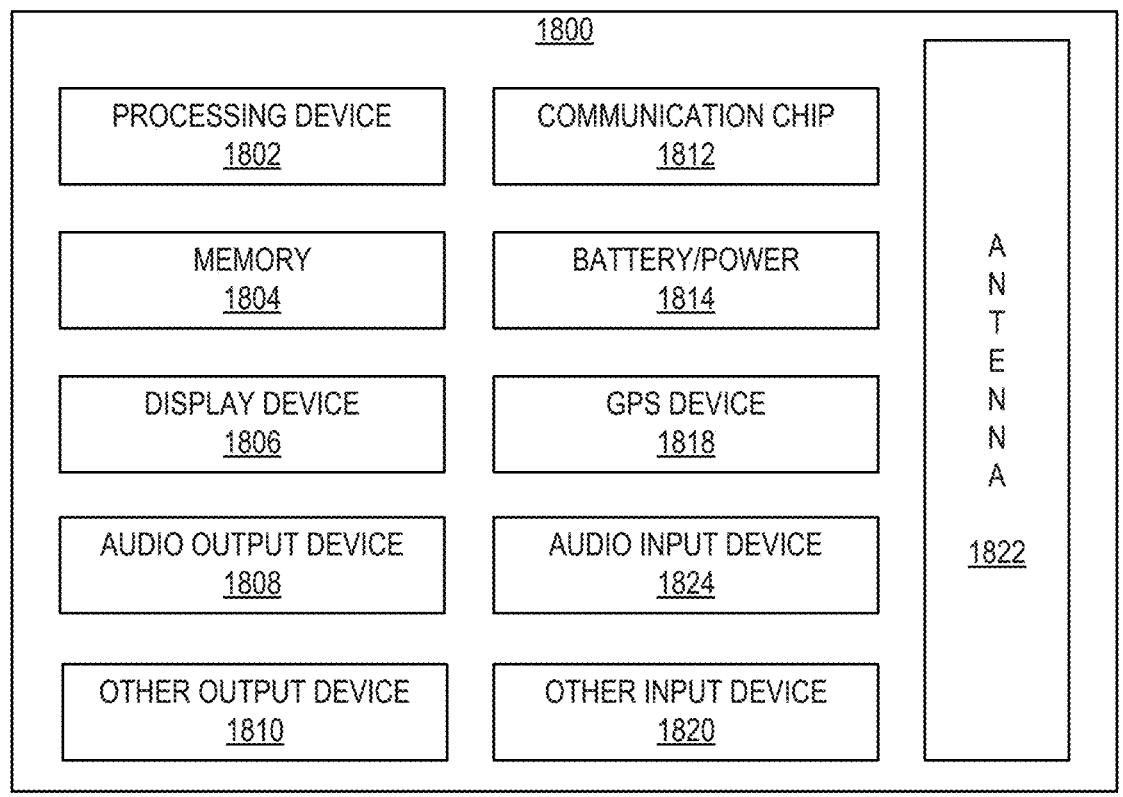
FIG. 13 is a block diagram of an example electrical device that may include an IC package support in accordance with any of the embodiments disclosed herein.

FIG. 13 is a block diagram of an example electrical device 1800 that may include one or more IC package supports 100 in accordance with any of the embodiments disclosed herein. Any suitable ones of the components of the electrical device 1800 may include one or more of the IC device assemblies 1700 or IC packages 1650 disclosed herein. A number of components are illustrated in FIG. 13 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 13, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein Example 1 is an electronic apparatus, including: an integrated circuit (IC) package support, including a dielectric material, wherein the dielectric material is non-photoimageable, and a conductive via through the dielectric material, wherein the conductive via has a diameter that is less than 20 microns.

Example 2 may include the subject matter of Example 1, and may further specify that the conductive via has tapered sidewalls with an angle that is greater than 80 degrees.

Example 3 may include the subject matter of Example 1, and may further specify that the conductive via has tapered sidewalls with an angle that is greater than 85 degrees.

Example 4 may include the subject matter of any of Examples 1-3, and may further specify that the dielectric material is a build-up material.

Example 5 may include the subject matter of any of Examples 1-4, and may further specify that the IC package support further includes: an adhesion promoter material on sidewalls of the conductive via.

Example 6 may include the subject matter of Example 5, and may further specify that the adhesion promoter material includes nitrogen or oxygen.

Example 7 may include the subject matter of Example 6, and may further specify that the adhesion promoter material includes silicon.

Example 8 may include the subject matter of any of Examples 1-7, and may further specify that the IC package support further includes: a conductive pad in the dielectric material, wherein the conductive via is in electrical contact with the conductive pad.

Example 9 may include the subject matter of Example 8, and may further specify that the conductive via is a first conductive via, the IC package support further includes a second conductive via, the conductive pad is between the first conductive via and the second conductive via, and the IC package support includes titanium between the second conductive via and the conductive pad.

Example 10 may include the subject matter of Example 9, and may further specify that the second conductive via has tapered sidewalls with an angle that is greater than 80 degrees.

Example 11 may include the subject matter of any of Examples 8-9, and may further specify that the dielectric material is a first dielectric material, the IC package support further includes a second dielectric material, and the conductive pad is on a planarized surface of the second dielectric material.

Example 12 may include the subject matter of Example 11, and may further specify that the first dielectric material includes a first fill material having a first particle size, the second dielectric material includes a second fill material having a second particle size, and the second particle size is greater than the first particle size.

Example 13 may include the subject matter of any of Examples 8-12, and may further specify that the diameter of the conductive via is equal to a width of the conductive pad.

Example 14 may include the subject matter of any of Examples 1-13, and may further specify that the conductive via includes copper.

Example 15 may include the subject matter of any of Examples 1-14, and may further specify that the conductive via has a diameter between 2 microns and 15 microns.

Example 16 may include the subject matter of any of Examples 1-15, and may further specify that the dielectric material includes silica filler particles.

Example 17 may include the subject matter of any of Examples 1-16, and may further specify that the dielectric material has a coefficient of thermal expansion that is less than 20 parts per million.

Example 18 may include the subject matter of any of Examples 1-17, and may further specify that the dielectric material has a loss tangent less than 0.005.

Example 19 may include the subject matter of any of Examples 1-18, and may further specify that the IC package support further includes: a conductive contact having an organic solderable preservative thereon.

Example 20 may include the subject matter of Example 19, and may further specify that the IC package support further includes: a solder resist between at least a portion of the conductive contact and the dielectric material.

Example 21 may include the subject matter of any of Examples 1-20, and may further specify that the conductive via is a first conductive via, and the IC package support further includes: a second conductive via through the dielectric material, wherein the second conductive via has tapered sidewalls with an angle that is less than 80 degrees.

Example 22 may include the subject matter of Example 21, and may further specify that the second conductive via has a height that is greater than a height of the first conductive via.

Example 23 may include the subject matter of any of Examples 1-22, and may further specify that the IC package support is a package substrate.

Example 24 may include the subject matter of any of Examples 1-22, and may further specify that the IC package support is an interposer.

Example 25 may include the subject matter of any of Examples 1-24, and may further include: a die coupled to the IC package support.

Example 26 may include the subject matter of any of Examples 1-25, and may further specify that the IC package support is included in an IC package, the electronic apparatus further includes a circuit board, and the IC package is coupled to the circuit board.

Example 27 may include the subject matter of Example 26, and may further include: an antenna coupled to the circuit board.

Example 28 may include the subject matter of any of Examples 1-27, and may further include: multiple dies coupled to the IC package support.

Example 29 may include the subject matter of Example 28, and may further specify that the multiple dies include at least one logic die and at least one memory die.

Example 30 may include the subject matter of Example 29, and may further specify that the multiple dies include multiple memory dies.

Example 31 may include the subject matter of any of Examples 1-30, and may further specify that the electronic apparatus is a server device.

Example 32 may include the subject matter of any of Examples 1-31, and may further specify that the electronic apparatus is a handheld computing device.

Example 33 is an electronic apparatus, including: an integrated circuit (IC) package support, including a first dielectric material having a planarized top surface, wherein the first dielectric material includes first filler particles having a first particle size, and a second dielectric material on the top surface of the first dielectric material, wherein the second dielectric material includes second filler particles having a second particle size, and the second particle size is smaller than the first particle size.

Example 34 may include the subject matter of Example 33, and may further include: a conductive via through the second dielectric material, wherein the conductive via has a diameter that is less than 20 microns.

Example 35 may include the subject matter of Example 34, and may further specify that the conductive via has tapered sidewalls with an angle that is greater than 80 degrees.

Example 36 may include the subject matter of Example 34, and may further specify that the conductive via has tapered sidewalls with an angle that is greater than 85 degrees.

Example 37 may include the subject matter of any of Examples 34-36, and may further specify that the IC package support further includes: an adhesion promoter material on sidewalls of the conductive via.

Example 38 may include the subject matter of Example 37, and may further specify that the adhesion promoter material includes nitrogen or oxygen.

Example 39 may include the subject matter of Example 38, and may further specify that the adhesion promoter material includes silicon.

Example 40 may include the subject matter of any of Examples 37-38, and may further specify that the IC package support further includes: a conductive line in the second dielectric material, wherein the adhesion promoter material is on sidewalls and the top surface of the conductive line.

Example 41 may include the subject matter of any of Examples 34-40, and may further specify that the IC package support further includes: a conductive pad in the second dielectric material, wherein the conductive via is in electrical contact with the conductive pad.

Example 42 may include the subject matter of Example 41, and may further specify that the conductive via is a first conductive via, the IC package support further includes a second conductive via, the conductive pad is between the first conductive via and the second conductive via, and the IC package support includes titanium between the second conductive via and the conductive pad.

Example 43 may include the subject matter of Example 42, and may further specify that the second conductive via has tapered sidewalls with an angle that is greater than 80 degrees.

Example 44 may include the subject matter of any of Examples 41-43, and may further specify that the diameter of the conductive via is equal to a width of the conductive pad.

Example 45 may include the subject matter of any of Examples 34-44, and may further specify that the conductive via includes copper.

Example 46 may include the subject matter of any of Examples 34-45, and may further specify that the conductive via has a diameter between 2 microns and 15 microns.

Example 47 may include the subject matter of any of Examples 34-46, and may further specify that the conductive via is a first conductive via, and the IC package support further includes: a second conductive via through the second dielectric material, wherein the second conductive via has tapered sidewalls with an angle that is less than 80 degrees.

Example 48 may include the subject matter of Example 47, and may further specify that the second conductive via has a height that is greater than a height of the first conductive via.

Example 49 may include the subject matter of any of Examples 33-48, and may further specify that the second dielectric material is a build-up material.

Example 50 may include the subject matter of any of Examples 33-49, and may further specify that the first dielectric material is a build-up material.

Example 51 may include the subject matter of any of Examples 33-50, and may further specify that the first filler particles include silica.

Example 52 may include the subject matter of Example 51, and may further specify that the second filler particles include silica.

Example 53 may include the subject matter of any of Examples 33-52, and may further specify that the second dielectric material has a coefficient of thermal expansion that is less than 20 parts per million.

Example 54 may include the subject matter of any of Examples 33-53, and may further specify that the second dielectric material has a loss tangent less than 0.005.

Example 55 may include the subject matter of any of Examples 33-54, and may further specify that the second dielectric material is non-photoimageable.

Example 56 may include the subject matter of any of Examples 33-55, and may further specify that the IC package support further includes: a conductive contact having an organic solderable preservative thereon.

Example 57 may include the subject matter of Example 56, and may further specify that the IC package support further includes: a solder resist between at least a portion of the conductive contact and the second dielectric material.

Example 58 may include the subject matter of any of Examples 33-57, and may further specify that the IC package support is a package substrate.

Example 59 may include the subject matter of any of Examples 33-57, and may further specify that the IC package support is an interposer.

Example 60 may include the subject matter of any of Examples 33-59, and may further include: a die coupled to the IC package support.

Example 61 may include the subject matter of any of Examples 33-60, and may further specify that the IC package support is included in an IC package, the electronic apparatus further includes a circuit board, and the IC package is coupled to the circuit board.

Example 62 may include the subject matter of Example 61, and may further include: an antenna coupled to the circuit board.

Example 63 may include the subject matter of any of Examples 33-62, and may further include: multiple dies coupled to the IC package support.

Example 64 may include the subject matter of Example 63, and may further specify that the multiple dies include at least one logic die and at least one memory die.

Example 65 may include the subject matter of Example 64, and may further specify that the multiple dies include multiple memory dies.

Example 66 may include the subject matter of any of Examples 33-65, and may further specify that the electronic apparatus is a server device.

Example 67 may include the subject matter of any of Examples 33-65, and may further specify that the electronic apparatus is a handheld computing device.

Example 68 is an electronic apparatus, including: an integrated circuit (IC) package support, including a dielectric material having a planarized top surface, and a conductive via through the dielectric material, wherein the conductive via has tapered sidewalls with an angle that is greater than 80 degrees.

Example 69 may include the subject matter of Example 68, and may further specify that the dielectric material is non-photoimageable.

Example 70 may include the subject matter of any of Examples 68-69, and may further specify that the conductive via has a diameter that is less than 20 microns.

Example 71 may include the subject matter of any of Examples 68-70, and may further specify that the conductive via has tapered sidewalls with an angle that is greater than 85 degrees.

Example 72 may include the subject matter of any of Examples 68-71, and may further specify that the dielectric material is a build-up material.

Example 73 may include the subject matter of any of Examples 68-72, and may further specify that the IC package support further includes: an adhesion promoter material on sidewalls of the conductive via.

Example 74 may include the subject matter of Example 73, and may further specify that the adhesion promoter material includes nitrogen or oxygen.

Example 75 may include the subject matter of Example 74, and may further specify that the adhesion promoter material includes silicon.

Example 76 may include the subject matter of any of Examples 68-75, and may further specify that the IC package support further includes: a conductive pad in the dielectric material, wherein the conductive via is in electrical contact with the conductive pad.

Example 77 may include the subject matter of Example 76, and may further specify that the conductive via is a first conductive via, the IC package support further includes a second conductive via, the conductive pad is between the first conductive via and the second conductive via, and the IC package support includes titanium between the second conductive via and the conductive pad.

Example 78 may include the subject matter of Example 77, and may further specify that the second conductive via has tapered sidewalls with an angle that is greater than 80 degrees.

Example 79 may include the subject matter of any of Examples 76-77, and may further specify that the dielectric material is a first dielectric material, the IC package support further includes a second dielectric material, and the conductive pad is on a planarized surface of the second dielectric material.

Example 80 may include the subject matter of Example 79, and may further specify that the first dielectric material includes a first fill material having a first particle size, the second dielectric material includes a second fill material having a second particle size, and the second particle size is greater than the first particle size.

Example 81 may include the subject matter of any of Examples 76-80, and may further specify that a diameter of the conductive via is equal to a width of the conductive pad.

Example 82 may include the subject matter of any of Examples 68-81, and may further specify that the conductive via includes copper.

Example 83 may include the subject matter of any of Examples 68-82, and may further specify that the conductive via has a diameter between 2 microns and 15 microns.

Example 84 may include the subject matter of any of Examples 68-83, and may further specify that the dielectric material includes silica filler particles.

Example 85 may include the subject matter of any of Examples 68-84, and may further specify that the dielectric material has a coefficient of thermal expansion that is less than 20 parts per million.

Example 86 may include the subject matter of any of Examples 68-85, and may further specify that the dielectric material has a loss tangent less than 0.005.

Example 87 may include the subject matter of any of Examples 68-86, and may further specify that the IC package support further includes: a conductive contact having an organic solderable preservative thereon.

Example 88 may include the subject matter of Example 87, and may further specify that the IC package support further includes: a solder resist between at least a portion of the conductive contact and the dielectric material.

Example 89 may include the subject matter of any of Examples 68-88, and may further specify that the conductive via is a first conductive via, and the IC package support further includes: a second conductive via through the dielectric material, wherein the second conductive via has tapered sidewalls with an angle that is less than 80 degrees.

Example 90 may include the subject matter of Example 89, and may further specify that the second conductive via has a height that is greater than a height of the first conductive via.

Example 91 may include the subject matter of any of Examples 68-90, and may further specify that the IC package support is a package substrate.

Example 92 may include the subject matter of any of Examples 68-90, and may further specify that the IC package support is an interposer.

Example 93 may include the subject matter of any of Examples 68-92, and may further include: a die coupled to the IC package support.

Example 94 may include the subject matter of any of Examples 68-93, and may further specify that the IC package support is included in an IC package, the electronic apparatus further includes a circuit board, and the IC package is coupled to the circuit board.

Example 95 may include the subject matter of Example 94, and may further include: an antenna coupled to the circuit board.

Example 96 may include the subject matter of any of Examples 68-95, and may further include: multiple dies coupled to the IC package support.

Example 97 may include the subject matter of Example 96, and may further specify that the multiple dies include at least one logic die and at least one memory die.

Example 98 may include the subject matter of Example 97, and may further specify that the multiple dies include multiple memory dies.

Example 99 may include the subject matter of any of Examples 68-98, and may further specify that the electronic apparatus is a server device.

Example 100 may include the subject matter of any of Examples 68-98, and may further specify that the electronic apparatus is a handheld computing device.

Example 101 is an electronic apparatus, including: an integrated circuit (IC) package support, including a dielectric material, a conductive pad in the dielectric material, a conductive via through the dielectric material and in electrical contact with the conductive pad, and an adhesion promoter material on sidewalls of the conductive via, wherein the adhesion promoter material is not between the conductive via and the conductive pad.

Example 102 may include the subject matter of Example 101, and may further specify that the dielectric material is non-photoimageable.

Example 103 may include the subject matter of any of Examples 101-102, and may further specify that the conductive via has a diameter that is less than 20 microns.

Example 104 may include the subject matter of any of Examples 101-103, and may further specify that the conductive via has tapered sidewalls with an angle that is greater than 80 degrees.

Example 105 may include the subject matter of any of Examples 101-104, and may further specify that the conductive via has tapered sidewalls with an angle that is greater than 85 degrees.

Example 106 may include the subject matter of any of Examples 101-105, and may further specify that the dielectric material is a build-up material.

Example 107 may include the subject matter of any of Examples 101-106, and may further specify that the adhesion promoter material includes nitrogen or oxygen.

Example 108 may include the subject matter of Example 107, and may further specify that the adhesion promoter material includes silicon.

Example 109 may include the subject matter of any of Examples 101-108, and may further specify that the conductive via is a first conductive via, the IC package support further includes a second conductive via, the conductive pad is between the first conductive via and the second conductive via, and the IC package support includes titanium between the second conductive via and the conductive pad.

Example 110 may include the subject matter of Example 109, and may further specify that the second conductive via has tapered sidewalls with an angle that is greater than 80 degrees.

Example 111 may include the subject matter of any of Examples 101-110, and may further specify that the dielectric material is a first dielectric material, the IC package support further includes a second dielectric material, and the conductive pad is on a planarized surface of the second dielectric material.

Example 112 may include the subject matter of Example 111, and may further specify that the first dielectric material includes a first fill material having a first particle size, the second dielectric material includes a second fill material having a second particle size, and the second particle size is greater than the first particle size.

Example 113 may include the subject matter of any of Examples 101-112, and may further specify that a diameter of the conductive via is equal to a width of the conductive pad.

Example 114 may include the subject matter of any of Examples 101-113, and may further specify that the conductive via includes copper.

Example 115 may include the subject matter of any of Examples 101-114, and may further specify that the conductive via has a diameter between 2 microns and 15 microns.

Example 116 may include the subject matter of any of Examples 101-115, and may further specify that the adhesion promoter material is on sidewalls of the conductive pad.

Example 117 may include the subject matter of any of Examples 101-116, and may further specify that the dielectric material includes silica filler particles.

Example 118 may include the subject matter of any of Examples 101-117, and may further specify that the dielectric material has a coefficient of thermal expansion that is less than 20 parts per million.

Example 119 may include the subject matter of any of Examples 101-118, and may further specify that the dielectric material has a loss tangent less than 0.005.

Example 120 may include the subject matter of any of Examples 101-119, and may further specify that the IC package support further includes: a conductive contact having an organic solderable preservative thereon.

Example 121 may include the subject matter of Example 120, and may further specify that the IC package support further includes: a solder resist between at least a portion of the conductive contact and the dielectric material.

Example 122 may include the subject matter of any of Examples 101-121, and may further specify that the conductive via is a first conductive via, and the IC package support further includes: a second conductive via through the dielectric material, wherein the second conductive via has tapered sidewalls with an angle that is less than 80 degrees.

Example 123 may include the subject matter of Example 122, and may further specify that the second conductive via has a height that is greater than a height of the first conductive via.

Example 124 may include the subject matter of any of Examples 101-123, and may further specify that the IC package support is a package substrate.

Example 125 may include the subject matter of any of Examples 101-123, and may further specify that the IC package support is an interposer.

Example 126 may include the subject matter of any of Examples 101-125, and may further include: a die coupled to the IC package support.

Example 127 may include the subject matter of any of Examples 101-126, and may further specify that the IC package support is included in an IC package, the electronic apparatus further includes a circuit board, and the IC package is coupled to the circuit board.

Example 128 may include the subject matter of Example 127, and may further include: an antenna coupled to the circuit board.

Example 129 may include the subject matter of any of Examples 101-128, and may further include: multiple dies coupled to the IC package support.

Example 130 may include the subject matter of Example 129, and may further specify that the multiple dies include at least one logic die and at least one memory die.

Example 131 may include the subject matter of Example 130, and may further specify that the multiple dies include multiple memory dies.

Example 132 may include the subject matter of any of Examples 101-131, and may further specify that the electronic apparatus is a server device.

Example 133 may include the subject matter of any of Examples 101-131, and may further specify that the electronic apparatus is a handheld computing device.

Example 134 is an electronic apparatus, including: an integrated circuit (IC) package support, including a first dielectric material including first fill particles having a first particle size, a conductive via through the first dielectric material, a second dielectric material on the first dielectric material, wherein the second dielectric material includes second fill particles having a second particle size, and the second particle size is smaller than the first particle size, a conductive pad in the second dielectric material, wherein the conductive via is in electrical contact with the conductive pad, and a material between the conductive pad and the conductive via, wherein the material includes titanium.

Example 135 may include the subject matter of Example 134, and may further specify that the second dielectric material is non-photoimageable.

Example 136 may include the subject matter of any of Examples 134-135, and may further specify that the conductive via has a diameter that is greater than 20 microns.

Example 137 may include the subject matter of any of Examples 134-136, and may further specify that the conductive via has tapered sidewalls with an angle that is less than 80 degrees.

Example 138 may include the subject matter of any of Examples 134-137, and may further specify that the second dielectric material is a build-up material.

Example 139 may include the subject matter of any of Examples 134-138, and may further specify that the IC package support further includes: an adhesion promoter material on sidewalls of the conductive pad.

Example 140 may include the subject matter of Example 139, and may further specify that the adhesion promoter material includes nitrogen or oxygen.

Example 141 may include the subject matter of Example 140, and may further specify that the adhesion promoter material includes silicon.

Example 142 may include the subject matter of any of Examples 134-141, and may further specify that the conductive via is a first conductive via, and the IC package support further includes: a second conductive via through the second dielectric material, wherein the second conductive via is in electrical contact with the conductive pad, and the conductive pad is between the first conductive via and the second conductive via.

Example 143 may include the subject matter of Example 142, and may further specify that the second conductive via has tapered sidewalls with an angle that is greater than 80 degrees.

Example 144 may include the subject matter of any of Examples 142-143, and may further specify that a diameter of the second conductive via is equal to a width of the conductive pad.

Example 145 may include the subject matter of any of Examples 142-144, and may further specify that the second conductive via has a diameter between 2 microns and 15 microns.

Example 146 may include the subject matter of any of Examples 134-145, and may further specify that the conductive pad is on a planarized surface of the first dielectric material.

Example 147 may include the subject matter of any of Examples 134-146, and may further specify that the conductive via includes copper.

Example 148 may include the subject matter of any of Examples 134-147, and may further specify that the second fill particles include silica.

Example 149 may include the subject matter of any of Examples 134-148, and may further specify that the second dielectric material has a coefficient of thermal expansion that is less than 20 parts per million.

Example 150 may include the subject matter of any of Examples 134-149, and may further specify that the second dielectric material has a loss tangent less than Example 0.005.

Example 151 may include the subject matter of any of Examples 134-150, and may further specify that the IC package support further includes: a conductive contact having an organic solderable preservative thereon.

Example 152 may include the subject matter of Example 151, and may further specify that the IC package support further includes: a solder resist between at least a portion of the conductive contact and the second dielectric material.

Example 153 may include the subject matter of any of Examples 134-152, and may further specify that the conductive via is a first conductive via, and the IC package support further includes: a second conductive via through the second dielectric material, wherein the second conductive via has tapered sidewalls with an angle that is less than 80 degrees.

Example 154 may include the subject matter of Example 153, and may further specify that the second conductive via has a height that is greater than a height of the first conductive via.

Example 155 may include the subject matter of any of Examples 134-154, and may further specify that the IC package support is a package substrate.

Example 156 may include the subject matter of any of Examples 134-154, and may further specify that the IC package support is an interposer.

Example 157 may include the subject matter of any of Examples 134-156, and may further include: a die coupled to the IC package support.

Example 158 may include the subject matter of any of Examples 134-157, and may further specify that the IC package support is included in an IC package, the electronic apparatus further includes a circuit board, and the IC package is coupled to the circuit board.

Example 159 may include the subject matter of Example 158, and may further include: an antenna coupled to the circuit board.

Example 160 may include the subject matter of any of Examples 134-159, and may further include: multiple dies coupled to the IC package support.

Example 161 may include the subject matter of Example 160, and may further specify that the multiple dies include at least one logic die and at least one memory die.

Example 162 may include the subject matter of Example 161, and may further specify that the multiple dies include multiple memory dies.

Example 163 may include the subject matter of any of Examples 134-162, and may further specify that the electronic apparatus is a server device.

Example 164 may include the subject matter of any of Examples 134-162, and may further specify that the electronic apparatus is a handheld computing device.

The invention claimed is:

1. An electronic apparatus, comprising:
   an integrated circuit (IC) package support, including:
      a first dielectric material,
      a first conductive via in the first dielectric material, wherein the first conductive via has tapered sidewalls with an angle that is equal to or less than 80 degrees,
      a second dielectric material on the first dielectric material, wherein the second dielectric material is non-photoimageable, and
      a second conductive via in the second dielectric material, wherein the second conductive via has tapered sidewalls with an angle that is greater than 80 degrees.

2. The electronic apparatus of claim 1, wherein the second conductive via has a diameter that is less than 20 microns.

3. The IC package support of claim 1, wherein the IC package support further includes:
   an adhesion promoter material on sidewalls of the second conductive via.

4. The electronic apparatus of claim 2, wherein the second conductive via has a diameter between 2 microns and 15 microns.

5. The electronic apparatus of claim 1, wherein the first dielectric material or the second dielectric material includes silica filler particles.

6. The electronic apparatus of claim 1, wherein the IC package support is a package substrate.

7. The electronic apparatus of claim 1, wherein the IC package support is an interposer.

8. An electronic apparatus, comprising:
   an integrated circuit (IC) package support, including:
      a first dielectric material having a planar top surface, wherein the first dielectric material includes first filler particles having a first particle size,
      a first conductive via in the first dielectric material, wherein the first conductive via has tapered sidewalls with an angle that is equal to or less than 80 degrees,
      a second dielectric material on the top surface of the first dielectric material, wherein the second dielectric material includes second filler particles having a second particle size, and the second particle size is smaller than the first particle size, and
      a second conductive via in the second dielectric material, wherein the second conductive via has tapered sidewalls with an angle that is greater than 80 degrees.

9. The electronic apparatus of claim 8, wherein the IC package support further includes:
   a conductive pad in the second dielectric material, wherein the second conductive via is in electrical contact with the conductive pad.

10. The electronic apparatus of claim 9, wherein the conductive pad is between the first conductive via and the second conductive via, and the IC package support includes titanium on the sidewalls of the second conductive via and on sidewalls of the conductive pad.

11. The electronic apparatus of claim 10, wherein the second conductive via has tapered sidewalls with an angle that is greater than 85 degrees.

12. The electronic apparatus of claim 8, wherein a diameter of the second conductive via is less than 20 microns.

13. The electronic apparatus of claim 12, wherein a diameter of the second conductive via is between 2 microns and 15 microns.

14. The electronic apparatus of claim 8, wherein the second dielectric material has a loss tangent less than 0.005.

15. An electronic apparatus, comprising:
    an integrated circuit (IC) package support, including:
       a first dielectric material having a planar top surface,
       a first conductive via in the first dielectric material, wherein the first conductive via has tapered sidewalls with an angle that is equal to or less than 80 degrees,
       a second dielectric material on the top surface of the first dielectric material, and
       a second conductive via in the second dielectric material, wherein the second conductive via has tapered sidewalls with an angle that is greater than 80 degrees.

16. The electronic apparatus of claim 15, wherein the second dielectric material is non-photoimageable.

17. The electronic apparatus of claim 15, wherein the second conductive via has a diameter between 2 microns and 15 microns.

18. The electronic apparatus of claim 15, wherein the first dielectric material or the second dielectric material includes silica filler particles.

19. The electronic apparatus of claim 15, further comprising:
    a die coupled to the IC package support.

20. The electronic apparatus of claim 15, wherein the IC package support is included in an IC package, the electronic apparatus further includes a circuit board, and the IC package is coupled to the circuit board.

21. An electronic apparatus, comprising:
    an integrated circuit (IC) package support, including:
       a first dielectric material,
       a first conductive via in the first dielectric material, wherein the first conductive via has tapered sidewalls with an angle that is equal to or less than 80 degrees,
       a second dielectric material on the first dielectric material,
       a conductive pad in the second dielectric material,
       a second conductive via in the second dielectric material and in electrical contact with the conductive pad, wherein the second conductive via has tapered sidewalls with an angle that is greater than 80 degrees, and
       an adhesion promoter material on the sidewalls of the second conductive via and on sidewalls of the conductive pad, wherein the adhesion promoter material is not between the second conductive via and the conductive pad.

22. The electronic apparatus of claim 21, wherein the adhesion promoter material includes nitrogen or oxygen.

23. The electronic apparatus of claim 22, wherein the adhesion promoter material includes silicon.

24. The electronic apparatus of claim 21, wherein the electronic apparatus is a server device.

25. The electronic apparatus of claim 21, wherein the electronic apparatus is a handheld computing device.

* * * * *

UNITED STATES PATENT AND TRADEMARK OFFICE
CERTIFICATE OF CORRECTION

PATENT NO. : 11,309,192 B2
APPLICATION NO. : 16/000205
DATED : April 19, 2022
INVENTOR(S) : Kristof Kuwawi Darmawikarta et al.

It is certified that error appears in the above-identified patent and that said Letters Patent is hereby corrected as shown below:

In the Claims

In Column 31, Line 17, Claim 3, delete "IC package support" and insert -- electronic apparatus --, therefor.

Signed and Sealed this
Third Day of October, 2023

Katherine Kelly Vidal
*Director of the United States Patent and Trademark Office*